United States Patent [19]

Darbee

[11] Patent Number: 5,255,313
[45] Date of Patent: * Oct. 19, 1993

[54] UNIVERSAL REMOTE CONTROL SYSTEM

[75] Inventor: Paul V. Darbee, Santa Ana, Calif.

[73] Assignee: Universal Electronics Inc., Twinsburg, Ohio

[*] Notice: The portion of the term of this patent subsequent to Jul. 13, 2010 has been disclaimed.

[21] Appl. No.: 46,105

[22] Filed: Apr. 8, 1993

Related U.S. Application Data

[63] Continuation of Ser. No. 587,326, Sep. 24, 1990, Pat. No. 5,228,077, which is a continuation-in-part of Ser. No. 127,999, Dec. 2, 1987, Pat. No. 4,959,810.

[51] Int. Cl.$^5$ .................... H04M 11/00; H04N 5/44
[52] U.S. Cl. .................................. 379/102; 358/194.1
[58] Field of Search ............... 379/102, 104, 105, 443, 379/444, 93, 97-99; 358/194.1, 142, 146, 147

[56] References Cited

U.S. PATENT DOCUMENTS

| | | | |
|---|---|---|---|
| 3,956,745 | 5/1976 | Ellis | 340/337 |
| 4,028,493 | 6/1977 | Brennemann et al. | |
| 4,038,533 | 7/1977 | Dummermuth et al. | 235/151.11 |
| 4,200,862 | 4/1980 | Campbell et al. | 340/310 A |
| 4,245,342 | 1/1981 | Entenman | 371/8 |
| 4,356,509 | 10/1982 | Skerlos et al. | 358/85 |
| 4,386,412 | 5/1983 | Ito | 364/710 |
| 4,386,436 | 5/1983 | Kocher et al. | 455/151 |
| 4,425,647 | 1/1984 | Collins et al. | 371/70 |
| 4,488,179 | 12/1984 | Kruger et al. | 358/181 |

(List continued on next page.)

FOREIGN PATENT DOCUMENTS

| | | |
|---|---|---|
| 3313493 | 10/1984 | Fed. Rep. of Germany . |
| 2053539A | 2/1981 | United Kingdom . |
| 2126000 | 3/1984 | United Kingdom . |
| 2136177A | 9/1984 | United Kingdom . |
| 2166322A | 4/1986 | United Kingdom . |

OTHER PUBLICATIONS

"IEEE Journal of Solid-State Circuits", vol. SC-11, No. 6, Dec. 1976, Casier et al., pp. 800-808, Pulse Position Modulation Transmission System for Remote Control of a TV Set.
"IEEE Transactions on Consumer Electronics", vol. CE-31, No. 1, Feb. 1985, pp. 59-69, J. Platte et al., A new intelligent remote control for consumer electronic devices.
"IEEE Spectrum", Mar. 1983, pp. 48-53, I. Dorros, Telephone nets go digital.

Primary Examiner—Wing F. Chan
Attorney, Agent, or Firm—Thomas R. Vigil

[57] ABSTRACT

The universal remote control system includes a computer having a memory and code data for creating appropriate IR lamp driver instructions for causing an infrared signal generator to emit infrared signals which will cause specific functions to occur in a specific controlled device, for operating a variety of devices to be controlled, stored in the memory of the computer. The system further includes a universal remote control comprising: input circuitry including a set of keys or pushbuttons for inputting commands into the remote control, infrared signal output circuitry including IR lamp driver circuitry for supplying an infrared signal to a controlled device, a central processing unit (CPU) coupled to the input circuitry and to the signal output circuitry, a memory coupled to the CPU, and data coupling circuitry and structure for periodically coupling the computer to the remote control for inputting from the computer memory appropriate IR lamp driver instructions for causing the infrared signal output circuitry to emit infrared signals which will cause specific functions to occur in a specific controlled device, for operating a variety of devices to be controlled into the memory of the remote control to enable the remote control to control various devices to be controlled upon the inputting of commands to the keys of the input circuitry.

20 Claims, 18 Drawing Sheets

U.S. PATENT DOCUMENTS

| | | | |
|---|---|---|---|
| 4,503,288 | 3/1985 | Kessler . | |
| 4,509,211 | 4/1985 | Robbins | 455/603 |
| 4,517,564 | 5/1985 | Morishita et al. | 340/825.69 |
| 4,535,333 | 8/1985 | Twardowski | 340/825.69 |
| 4,566,034 | 1/1986 | Harger et al. | 358/194.1 |
| 4,580,009 | 4/1986 | Darland . | |
| 4,599,491 | 7/1986 | Serrano . | |
| 4,623,887 | 11/1986 | Welles, II | 340/825.57 |
| 4,625,080 | 11/1986 | Scott | 379/104 |
| 4,626,847 | 12/1986 | Zato | 340/825.56 |
| 4,626,848 | 12/1986 | Ehlers | 340/825.69 |
| 4,703,359 | 10/1987 | Rumbolt et al. | 358/194.1 |
| 4,712,105 | 12/1987 | Kohler | 340/825.69 |
| 4,718,112 | 1/1988 | Shinoda | 455/151 |
| 4,746,919 | 5/1988 | Reitmeier | 340/825.56 |
| 4,769,643 | 9/1988 | Sogame | 340/825.69 |
| 4,771,283 | 9/1988 | Imoto | 340/825.71 |
| 4,774,511 | 9/1988 | Rumbolt et al. | 340/825.69 |
| 4,794,371 | 12/1988 | Yamamoto | 340/825.64 |
| 4,802,114 | 1/1988 | Sogame | 364/900 |
| 4,807,052 | 2/1989 | Amano | 358/194.1 |
| 4,825,200 | 4/1989 | Evans et al. | 341/23 |
| 4,841,368 | 6/1989 | Rumbolt et al. | 358/194.1 |
| 4,855,746 | 8/1989 | Stacy | 341/176 |
| 4,856,081 | 8/1989 | Smith | 455/151 |
| 4,860,380 | 8/1989 | Mengel | 455/185 |
| 4,866,434 | 9/1989 | Keenan | 340/825.72 |
| 4,875,096 | 10/1989 | Baer et al. | 358/143 |
| 4,885,766 | 12/1989 | Yasuoka et al. | 379/105 |
| 4,899,370 | 2/1990 | Kameo et al. | 379/104 |
| 4,918,439 | 4/1990 | Wozniak et al. | 340/825.69 |
| 4,965,557 | 10/1991 | Schepers et al. | 340/711 |
| 5,088,023 | 2/1992 | Nakamura et al. | 395/425 |

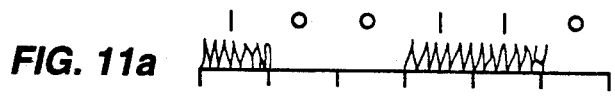
FIG. 11a — FIXED BIT TIME, FULL WIDTH BURST
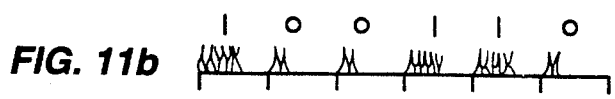
FIG. 11b — FIXED BIT TIME, BURST WIDTH MODULATED
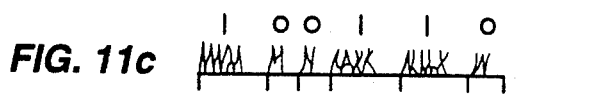
FIG. 11c — FIXED OFF TIME, BURST WIDTH MODULATED
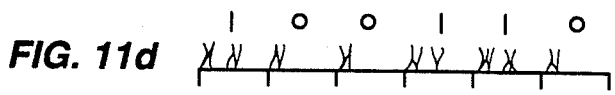
FIG. 11d — FIXED BIT TIME, SINGLE / DOUBLE BURST
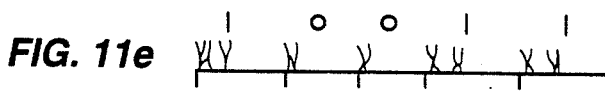
FIG. 11e — FIXED OFF TIME, SINGLE / DOUBLE BURST
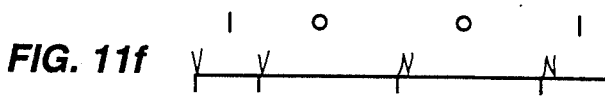
FIG. 11f — FIXED BURST TIME, OFF TIME MODULATED
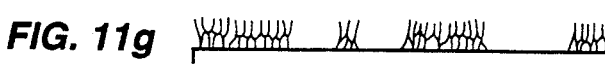
FIG. 11g — RANDOM
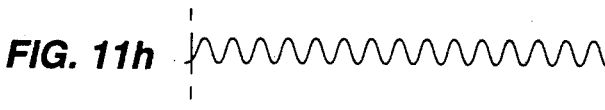
FIG. 11h — ONE FREQUENCY FOR EACH KEY
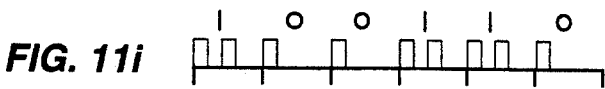
FIG. 11i — SINGLE / DOUBLE PULSE, FIXED BIT TIME

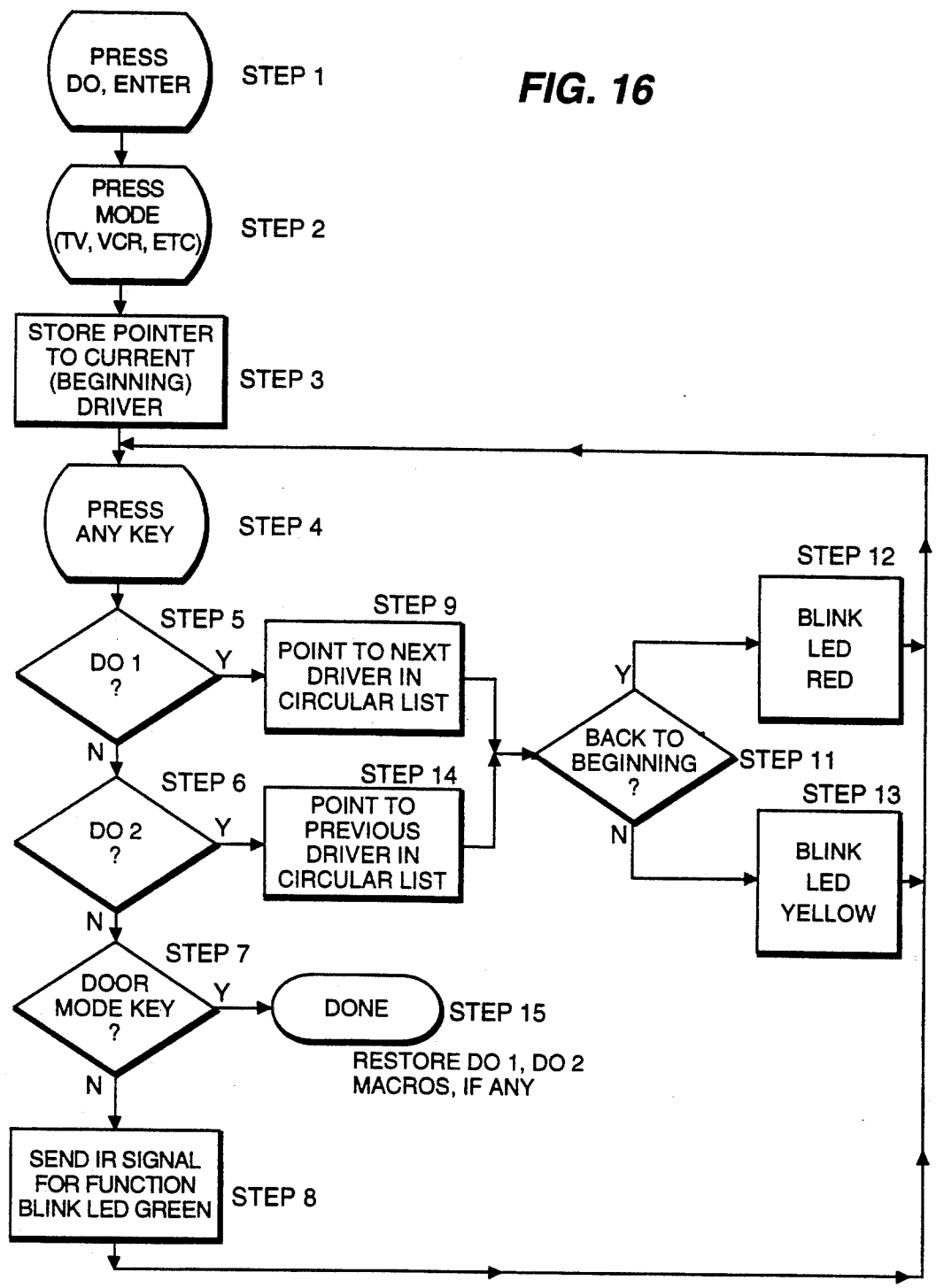

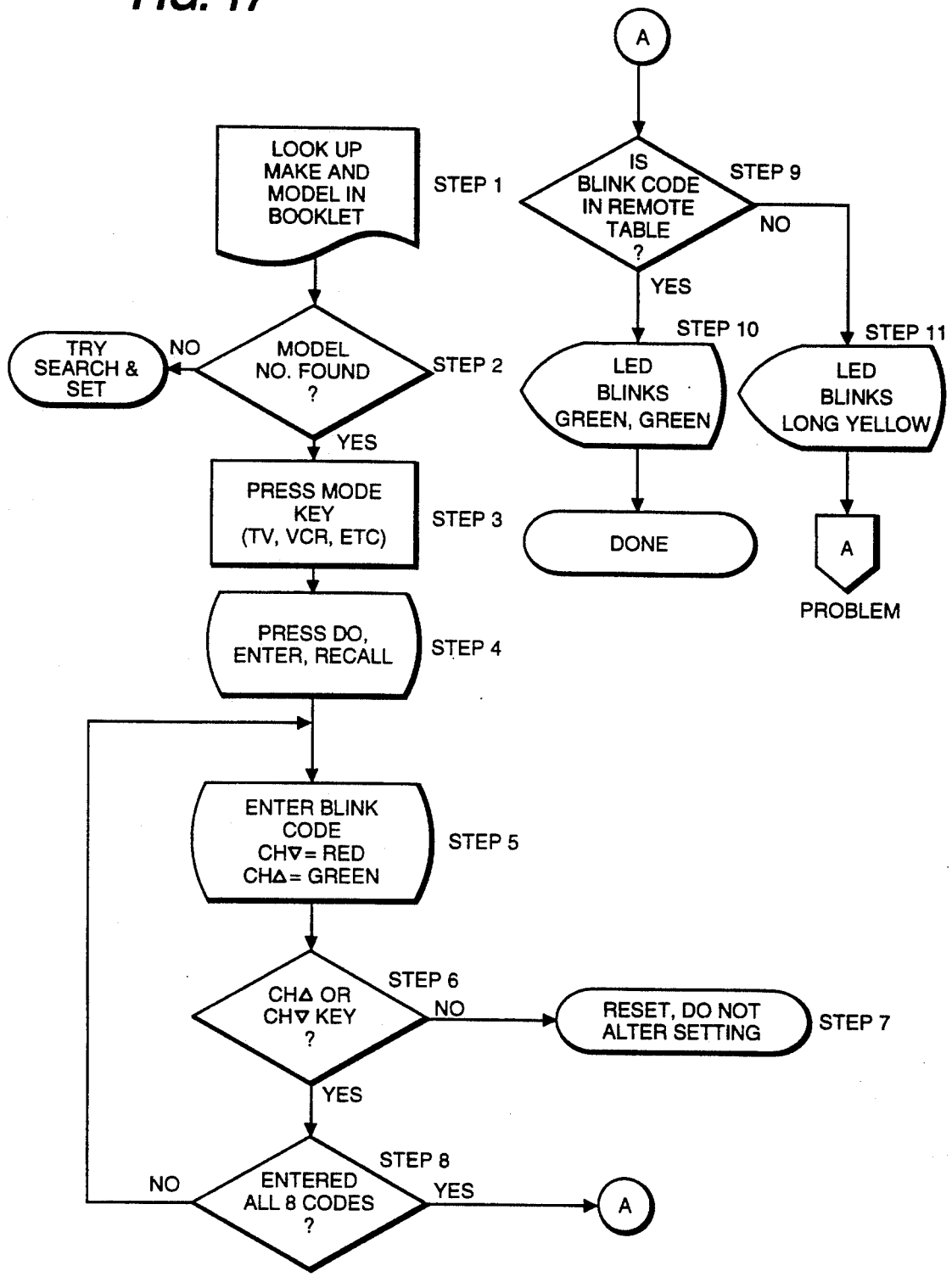

* eg. TV, POWER, VCR 1, POWER, PLAY, TV, 3, ENTER

UNIVERSAL REMOTE CONTROL SYSTEM

CROSS REFERENCE TO RELATED APPLICATION

This is a continuation of Ser. No. 07/587,326, filed on Sep. 24, 1990 now U.S. Pat. No. 5,228,077 which is a continuation-in-part of Ser. No. 07/127,999, filed on Dec. 2, 1987 now U.S. Pat. No. 4,959,810, on Sept. 25, 1990.

BACKGROUND OF THE INVENTION

1. Field of the Invention

The present invention relates to a universal remote control system including a remote control of the type which is hand held and which can be coupled via coded infrared signals with a remote control receiver built into a television or other remotely controlled electrical apparatus to turn on the apparatus, such as the television, at a distance, to adjust the volume, tone and brightness, to change channels, and to turn the television off and a data transmission system for inputting data to the remote control.

2. Description of the Related Art Including Information Disclosed under 37 CFR Sections 1.97-1.99

Heretofore it has been proposed to provide a reconfigurable remote control device and programmable functions for such a remote control device which will enable one to learn, store and retransmit infrared codes that are emitted from the controller for a remotely controlled apparatus, such as a television.

For example, in the Welles II U.S. Pat. No. 4,623,887 and the Ehlers U.S. Pat. No. 4,626,848, there is disclosed a reconfigurable remote control device which has the ability to learn, store and repeat remote control codes from any other infrared transmitter. Such a reconfigurable remote control transmitter device includes an infrared receiver, a microprocessor, a nonvolatile random access memory, a scratch pad random access memory, and an infrared transmitter.

According to the teachings of the Ehlers patent, the infrared signals received by the remote control device are in bursts of pulses and the device counts the number of pulses in each burst as well as the time duration of each pause in a transmission between bursts.

The Evans et al. U.S. Pat. No. 4,825,200 which issued on Apr. 25, 1989 on application Ser. No. 66,833 filed on Jun. 25, 1987, teaches a reconfigurable remote control transmitter that includes a learn mode and a run mode and is similar to the remote control system disclosed in the Ehlers patent.

Evans et al. does not teach or suggest the provision in a universal remote control of data coupling means including terminal means (such as serial ports) coupled to a CPU for enabling code data to be supplied from outside the remote control through the terminal means and CPU to a memory of the remote control.

The Imoto U.S. Pat. No. 4,771,283 teaches a system for the collecting of operating codes from various remote control transmitters by inputting the code data therefrom via infrared code signals to an infrared receiving diode at an input of the system, deciphering those code signals, storing them in a RAM and then upon operation of keys, supplying outputs via one of several cables extending from outputs of the system to devices to be controlled.

Imoto does not teach means for outputting infrared code signals nor does Imoto teach in a remote control, terminal means coupled to a CPU for supplying code data from outside the remote control through the terminal means and the CPU to a memory of the remote control.

SUMMARY OF THE INVENTION

According to the present invention there is provided a universal remote control system including a computer having a memory, code data for creating a appropriate infrared (IR) lamp driver instructions for causing an infrared signal generator to emit infrared signals which will cause specific functions to occur in a specific controlled device, for operating a variety of devices to be controlled, stored in the memory of the computer, a universal remote control comprising input circuitry including a set of keys or pushbuttons for inputting commands into the remote control, infrared signal output circuitry including IR lamp driver circuitry for supplying an infrared signal to a controlled device, a central processing unit (CPU) coupled to the input circuitry and to the signal output circuitry, a memory coupled to the CPU, and data coupling circuitry and structure for periodically coupling the computer to the remote control for receiving, from the computer memory said code data for creating appropriate IR lamp driver instructions for causing the infrared signal output circuitry to emit infrared signals which will cause specific functions to occur in a specific controlled device, for operating a variety of devices to be controlled, into the memory of the remote control to enable the remote control to control various devices to be controlled upon the inputting of commands to the keys of the input circuitry.

Also according to the present invention there is provided a universal remote control system including a computer having a memory, code data for creating appropriate infrared (IR) lamp driver instructions for causing an infrared signal generator to emit infrared signals which will cause specific functions to occur in a specific controlled device, for operating a variety of devices to be controlled, stored in the memory of the computer, a universal remote control comprising input circuitry including a set of keys or pushbuttons for inputting commands into the remote control, infrared signal output circuitry including IR lamp driver circuitry for supplying an infrared signal to a controlled device, a central processing unit (CPU) coupled to the input circuitry and to the signal output circuitry, a memory coupled to the CPU, and data coupling circuitry and structure for periodically coupling the computer to the remote control for receiving, from the computer memory said code data for creating appropriate IR lamp driver instructions for causing the infrared signal output circuitry to emit infrared signals which will cause specific functions to occur in a specific controlled device, for operating a variety of devices to be controlled, into the memory of the remote control to enable the remote control to control various devices to be controlled upon the inputting of commands to the keys of the input circuitry and a data transmission system including the data coupling circuitry for coupling the remote control to the computer, directly, through a telephone line, through a modem and a telephone line, or through decoding circuitry and a television set to receive a television signal picked up by the television set.

Further according to the present invention there is provided a universal remote control system including a universal remote control comprising input circuitry including a set of keys or pushbuttons for inputting commands into the remote control, infrared signal output circuitry including infrared (IR) lamp driver circuitry for supplying an infrared signal to a controlled device, a central processing unit (CPU) coupled to the input circuitry and to the signal output circuitry, a memory coupled to the CPU and data coupling circuitry and structure including terminal structure comprising a receiving port coupled to the CPU for enabling code data for creating appropriate IR lamp driver instructions for causing the infrared signal output circuitry to emit infrared signals which will cause specific functions to occur in a specific controlled device, for operating a variety of devices to be controlled, to be supplied from outside the remote control through the receiving port of the terminal structure directly to the CPU for direct entry to the a memory to enable the remote control to control various devices to be controlled upon the inputting of commands to the keys of the input circuitry and a data transmission system including coupling circuitry for coupling the terminal structure to a computer, directly, through a telephone line, through a modem and a telephone lien, or through decoding circuitry and a television set to receive a television signal picked up by the television set.

BRIEF DESCRIPTION OF THE DRAWINGS

FIGS. 11a to 11i are graphical representations of several modulation schemes which are used in infrared remote control transmitters.

FIG. 16 is a flow chart of the search and set procedure followed in using the control device of the present invention.

FIG. 17 is a flow chart of a direct-entry/quick-set procedure followed in using the remote control device.

DESCRIPTION OF THE PREFERRED EMBODIMENT

Figure 1:
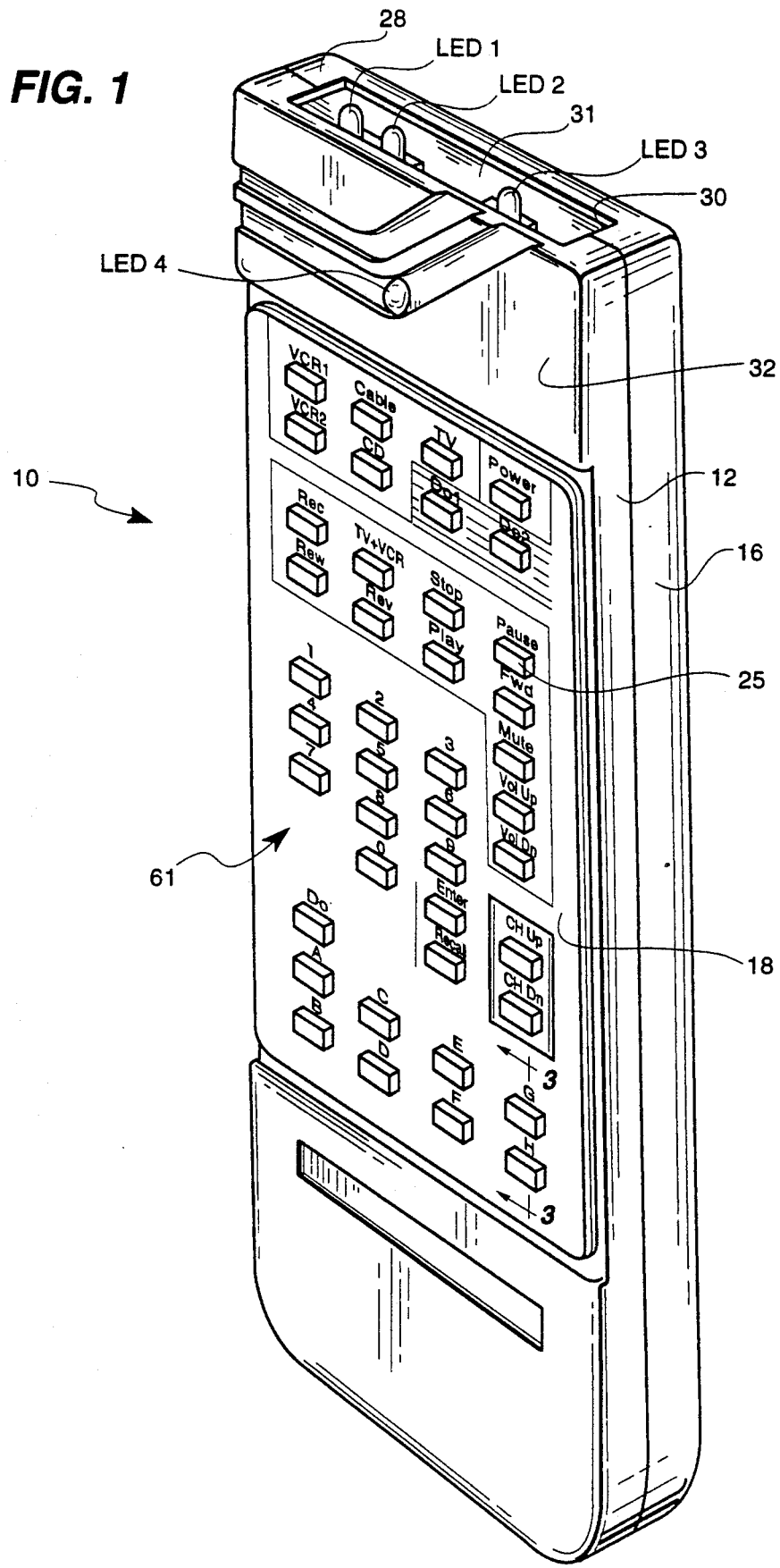
FIG. 1 is a front perspective view of the universal remote control device constructed according to the teachings of the present invention.

Referring now to FIG. 1 in greater detail, there is illustrated therein a universal remote control device 10 constructed according to the teachings of the present invention.

As shown, the device 10 includes a housing 11 including an upper housing member 12 having a base panel 14, and a lower housing member 16. An overlay face panel 18 is positioned over the base panel 14.

Figure 2:
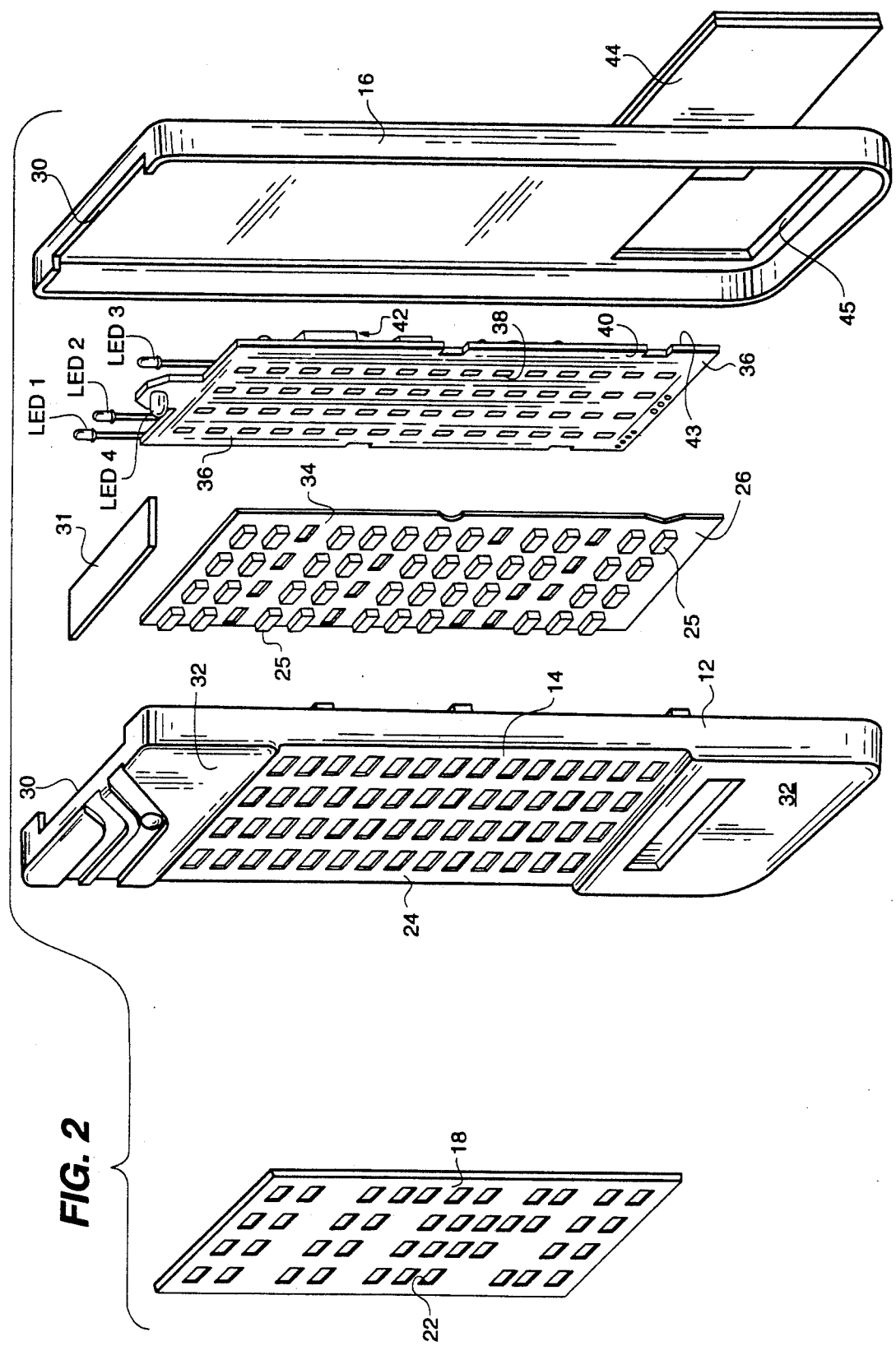
FIG. 2 is an exploded perspective view of the control device shown in FIG. 1.

The two panels 14 and 18 have openings 22 and 24 (FIG. 2) therethrough for receiving elastomeric pushbuttons 25, all of which extend from and are fixed to or integral with an elastomeric body panel 26 as shown in FIG. 2.

The pushbuttons 25 are arranged in rows and columns and are identified as follows on the overlay face panel 18:

| VCR 1 | Cable    | TV     | Power    |
|-------|----------|--------|----------|
| VCR 2 | CD       | DO 1   | DO 2     |
| Rec   | TV . VCR | Stop   | Pause    |
| Rew   | Reverse  | Play   | Fast Fwd |
|       |          |        | Mute     |
| 1     | 2        | 3      | Vol Up   |
| 4     | 5        | 6      | Vol Dn   |
| 7     | 8        | 9      |          |
|       | 0        | Enter  | CH Up    |
|       |          | Recall | CH Dn    |
| DO    |          |        |          |
| A     | C        | E      | G        |
| B     | D        | F      | H        |

Figure 15:
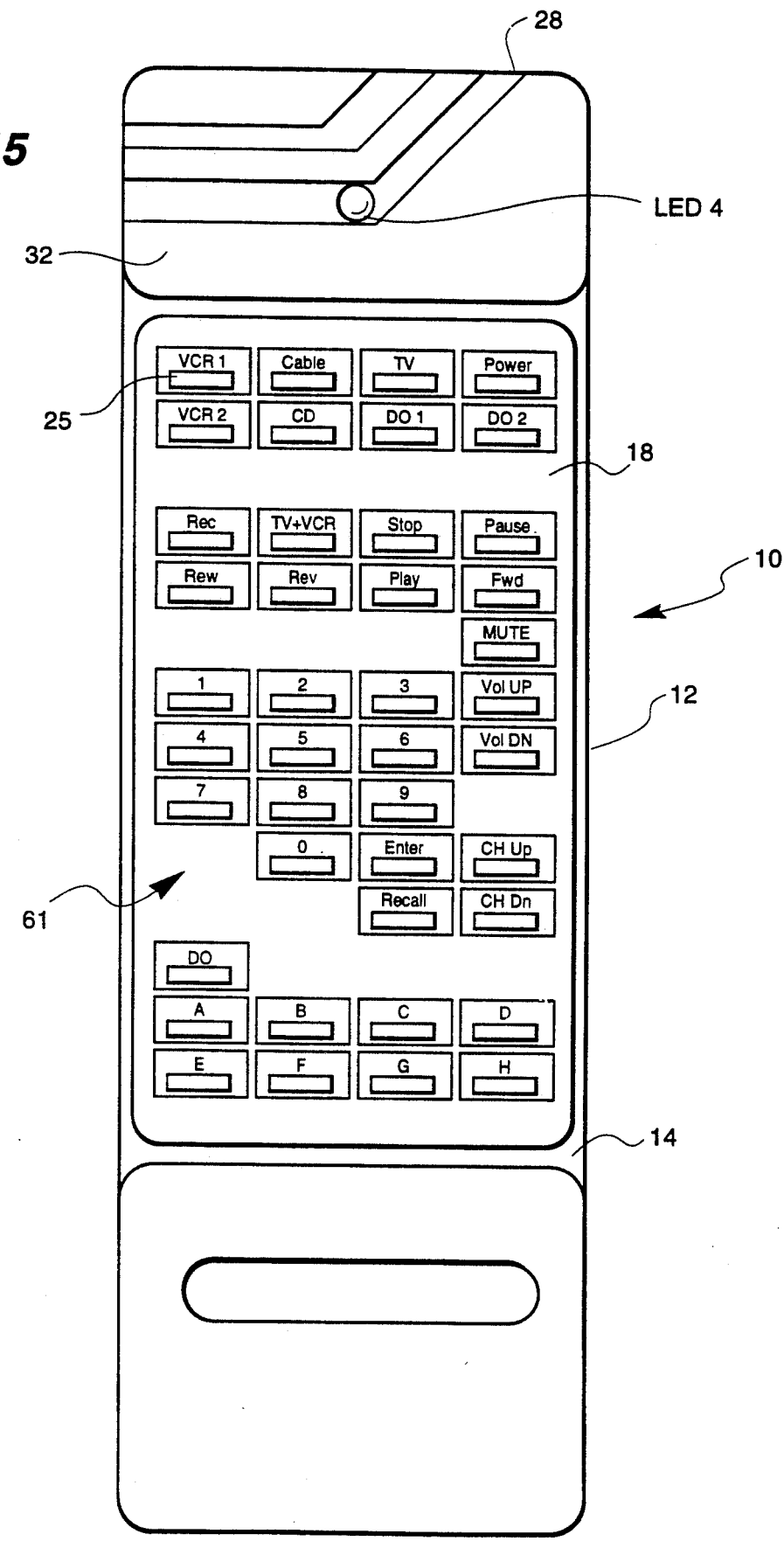
FIG. 15 is a front plan view of the control device shown in FIG. 1 and shows the various pushbuttons of the device.

This arrangement is shown in FIG. 15 and the manner in which these pushbuttons 25 are utilized in operating the control device 10 will be described in greater detail in connection with the description of FIGS. 15-19B.

At a top or forward end 28 of the device 10, there is provided an opening 30 for three light emitting diodes, LED 1, LED 2 and LED 3. The opening 30 is covered by an infrared-transport lens 31. Also, provided on a top surface 32 of the upper housing member 12 of the control device 10 is a light emitting diode, LED 4, by which information, in the form of red and green blink codes, is communicated to the user of the device 10.

FIG. 2 is an exploded view of the components of the device 10. As shown, the device 10 includes the overlay face panel 18 with pushbutton-receiving, generally rectangular openings 22, the upper housing member 12 with base panel 14 having a plurality of generally rectangular, pushbutton receiving openings 24, the elastomeric body panel 26 having pushbuttons 25 extending from an upper surface 34 thereof, a printed circuit board 36 having conductive switches 38 on an upper surface 40 thereof and operating circuitry 42 (FIG. 7) mounted on the underside 43 thereof, the lower housing member 16, a cover 44 for a battery compartment 45 (FIG. 7) for receiving batteries 46 (FIG. 10) for the circuitry 42 of the control device 10, and the infrared-transport lens 31.

It will be noted that the base panel 14 of the upper housing member 12 has pushbutton openings 24 completely across each one of fourteen (14) rows across and four (4) columns down. However, not all of these openings or holes 24 have pushbuttons 25 extending therethrough, as noted by the lesser number of pushbutton-receiving openings 22, in the overlay face panel 18. Likewise, the body panel 26 initially has pushbuttons 25 arranged completely across the upper surface 34 in fourteen (14) rows across and fourteen (14) columns down.

The printed circuit board 36 has conductive switches 38 aligned with each one of the pushbuttons 25 so that more switches 38 are provided than may be necessary for this particular control device 10.

The availability of additional pushbutton openings 24 in the base panel 14 will enable the control device 10 to be modified as necessary by the addition of further pushbuttons 25 to perform numerous other functions as called for.

This mechanical construction of the upper and lower housing members 12 and 16 and the panels 14 and 18 and circuit board 36 enable the control device 10 to be modified to include additional circuits in the operating circuitry 42 and pushbutton switches 25 for performing additional functions, if desired. In this respect, overlay face panel 18 is easily replaceable to modify the device 10 to include more or less pushbuttons 25 and associated switches 38.

Figure 3:
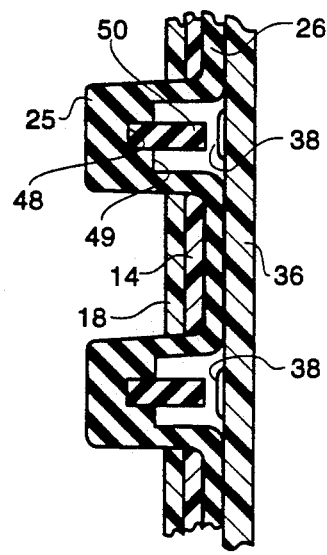
FIG. 3 is an enlarged fragmentary sectional view through two of the push buttons of the control device shown in FIGS. 1 and 2.
Figure 4:
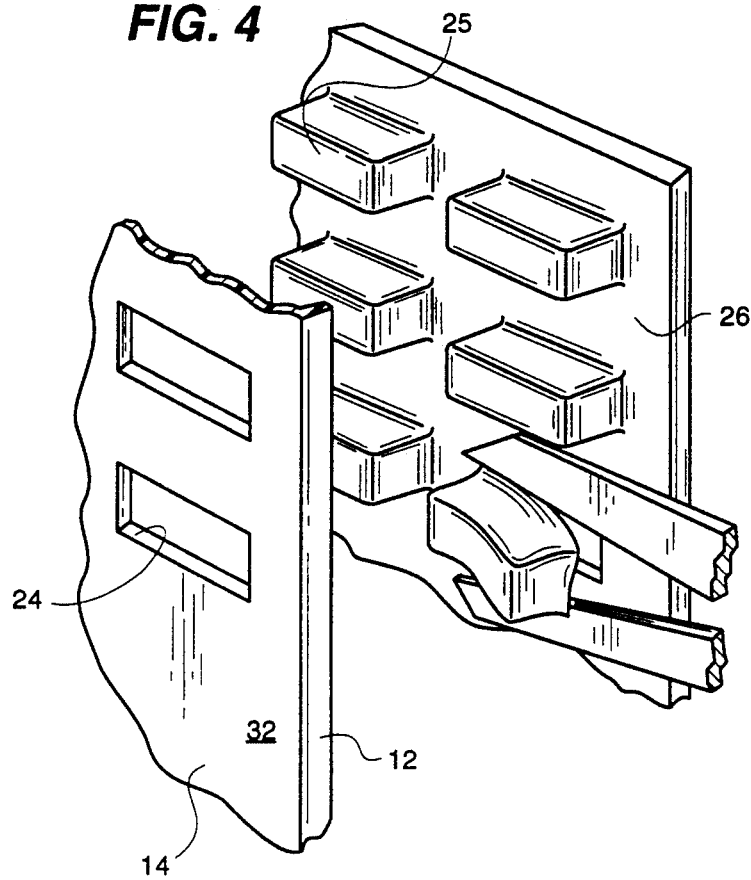
FIG. 4 is a fragmentary corner view of a push button containing panel and a base panel.

The simplicity of the construction of the pushbuttons 25, the base panel 14 and the overlay panel 18 is shown in FIGS. 3-6. As shown in FIG. 3, the body panel 26 has a plurality of raised pushbuttons 25 formed thereon. Each raised rectangular button 25 has a recessed area or hollow 48 on the underside 49 of each button 25 in which is mounted a conductive plunger or puck 50 adapted to engage one of the conductive switches 38 on the circuit board 36. With the pushbuttons 25 and the panel 26 being formed from a sheet of elastomeric material it is an easy matter to remove the buttons 25 that are not necessary with a scissors or other cutting element, as shown in FIG. 4.

Figure 5:
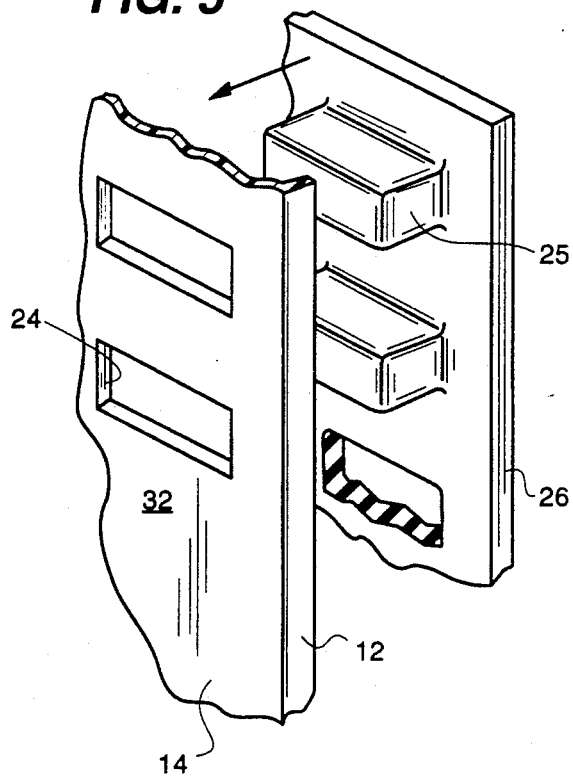
FIG. 5 is a fragmentary corner view similar to FIG. 4 as the panels are brought together and shows one of the push buttons cut away from the push button containing panel.
Figure 6:
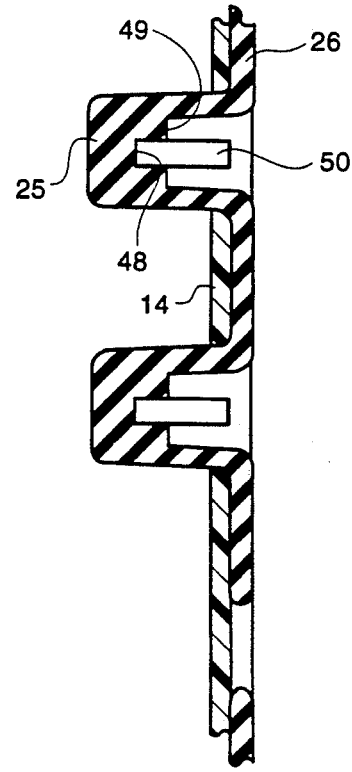
FIG. 6 is a fragmentary sectional view of the assembly 15 formed by bringing the push button containing panel into engagement with the base panel.

Then, the pushbutton body panel 26 is moved into engagement with the base panel 14, as shown in FIG. 5, to form the assembly shown in FIG. 6.

After the pushbutton body panel 26 and the base panel portion 14 have been assembled as shown in FIG. 6, the overlay face panel 18 is mounted on top of the base panel 14 and the circuit board 36 is mounted within the housing member 12.

Figure 7:
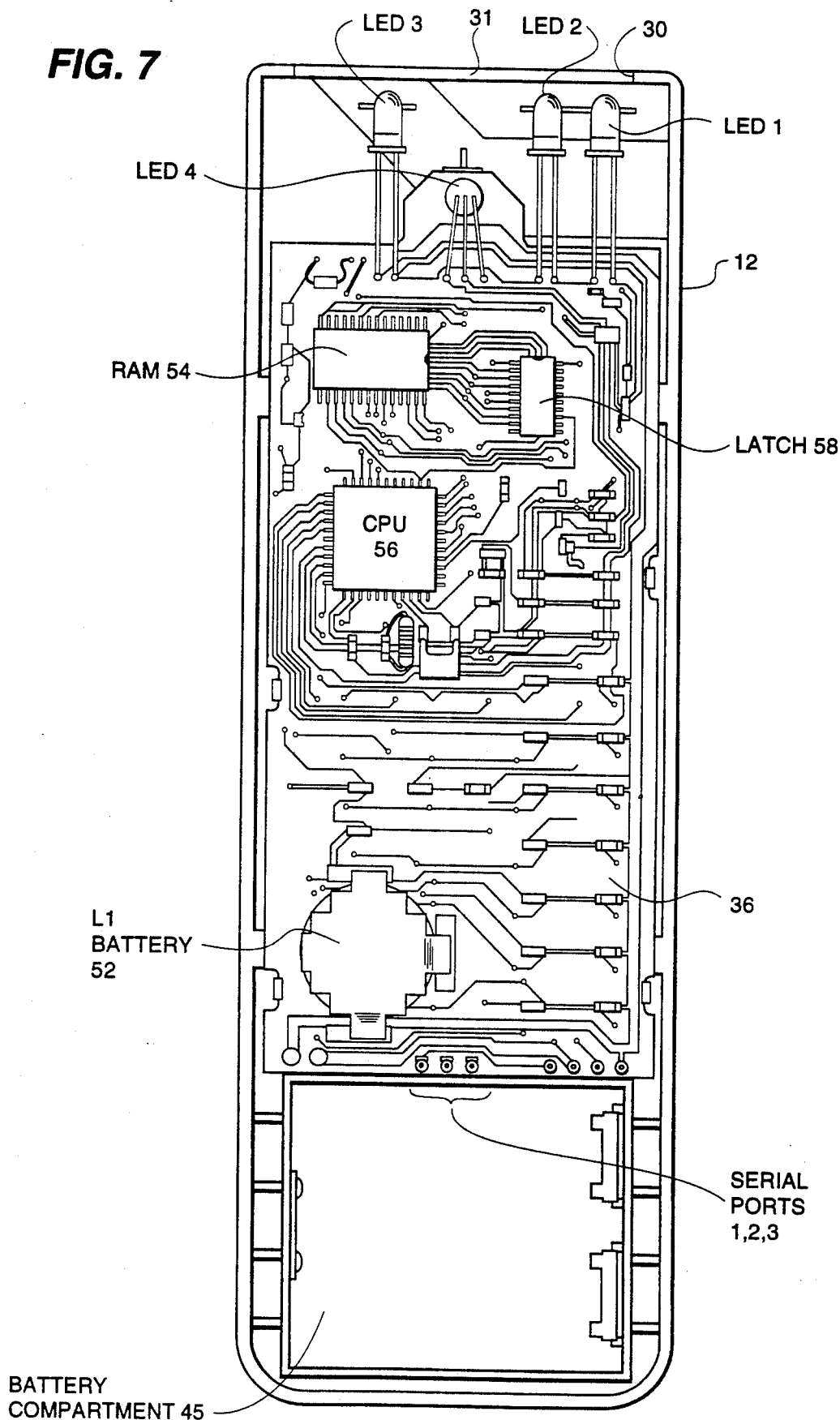
FIG. 7 is a plan view of the circuit board assembly mounted inside the control device viewing the control device from the back side thereof with a back cover panel removed.

Referring now to FIG. 7, there is illustrated therein the operating circuitry 42 of the control device 10 which includes batteries 46 (FIG. 10) mounted in the compartment 45 for providing power for the circuitry 42 and a lithium battery 52, which backs up a static RAM 54. A central processing unit (CPU) 56, is coupled through a latch 58 to the RAM 54. Three LEDs, LED 1, LED 2, and LED 3 are coupled to the circuitry 42 for communication with the apparatus to be controlled. All elements of the circuitry 42 are mounted on the circuit board 36 mounted in the upper housing member 12. A further LED, LED 4 is coupled to CPU 56 for communication with the user of the device 10 as will be described in greater detail below.

Figure 8:
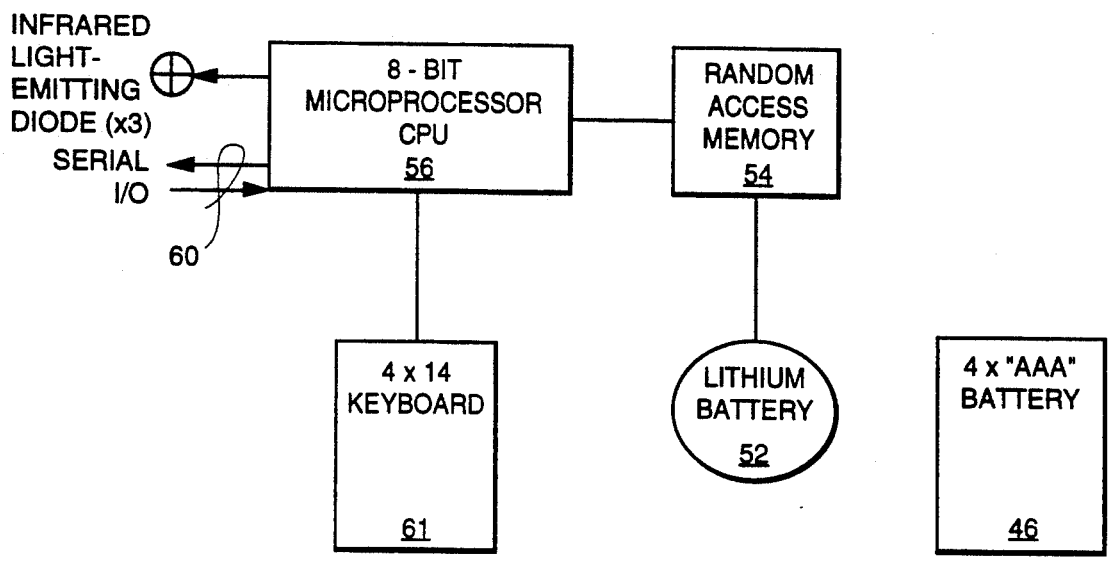
FIG. 8 is a block diagram of the operating circuitry in the control device.

A block schematic circuit diagram of the operating circuitry 42 is shown in FIG. 8 and includes CPU 56, the infrared light emitting diodes, LED 1, LED 2, and LED 3 coupled to the CPU 56, serial input/output ports 60 of CPU 56, the RAM 54 coupled to CPU 56 and backed up by lithium battery 52 and a 4×14 keyboard 61 coupled to CPU 56. The four AAA batteries 46 are also shown.

Figure 9A:
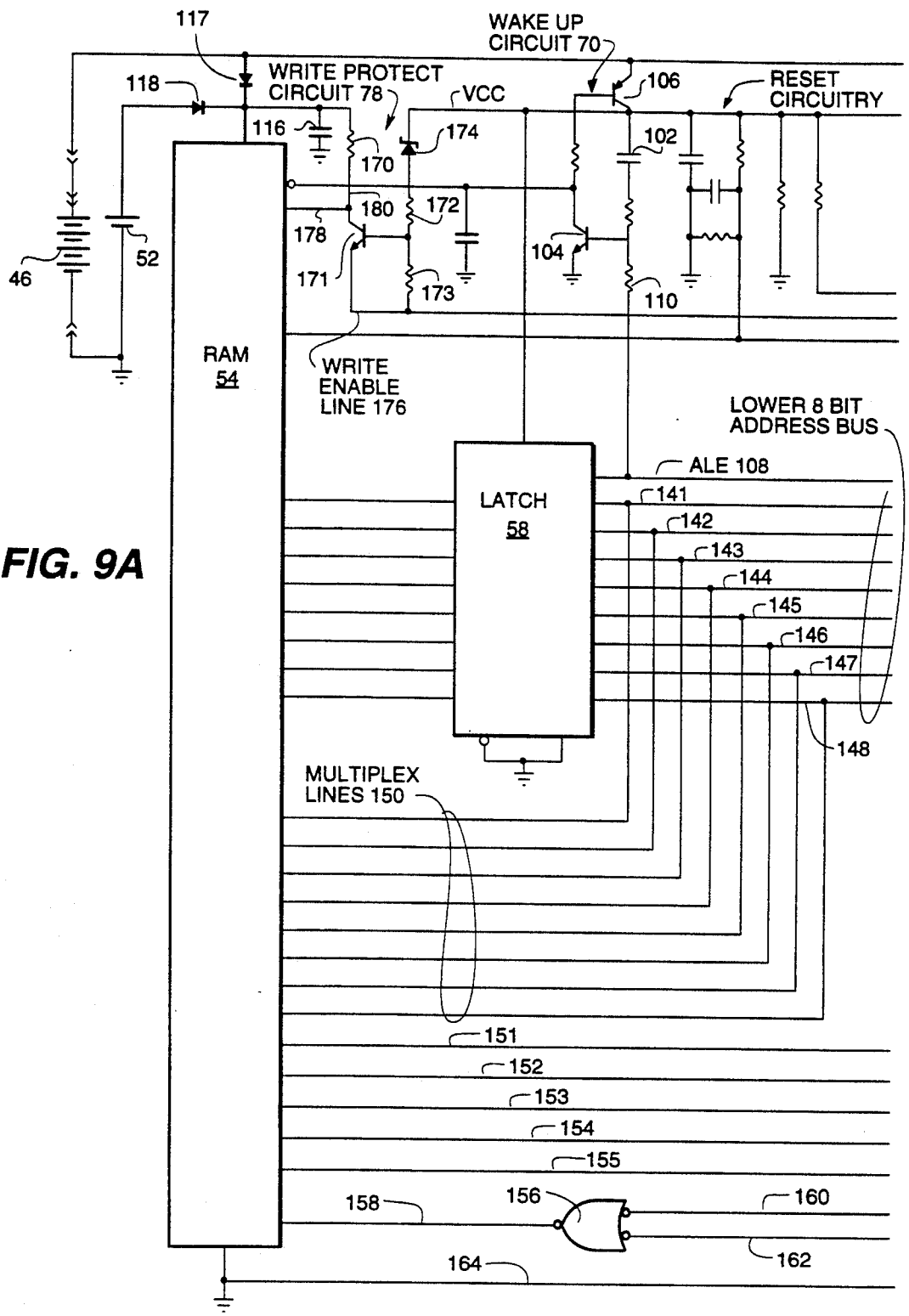
FIGS. 9A and 9B are a detailed schematic circuit diagram of the operating circuitry shown in FIG. 8.
Figure 9B:
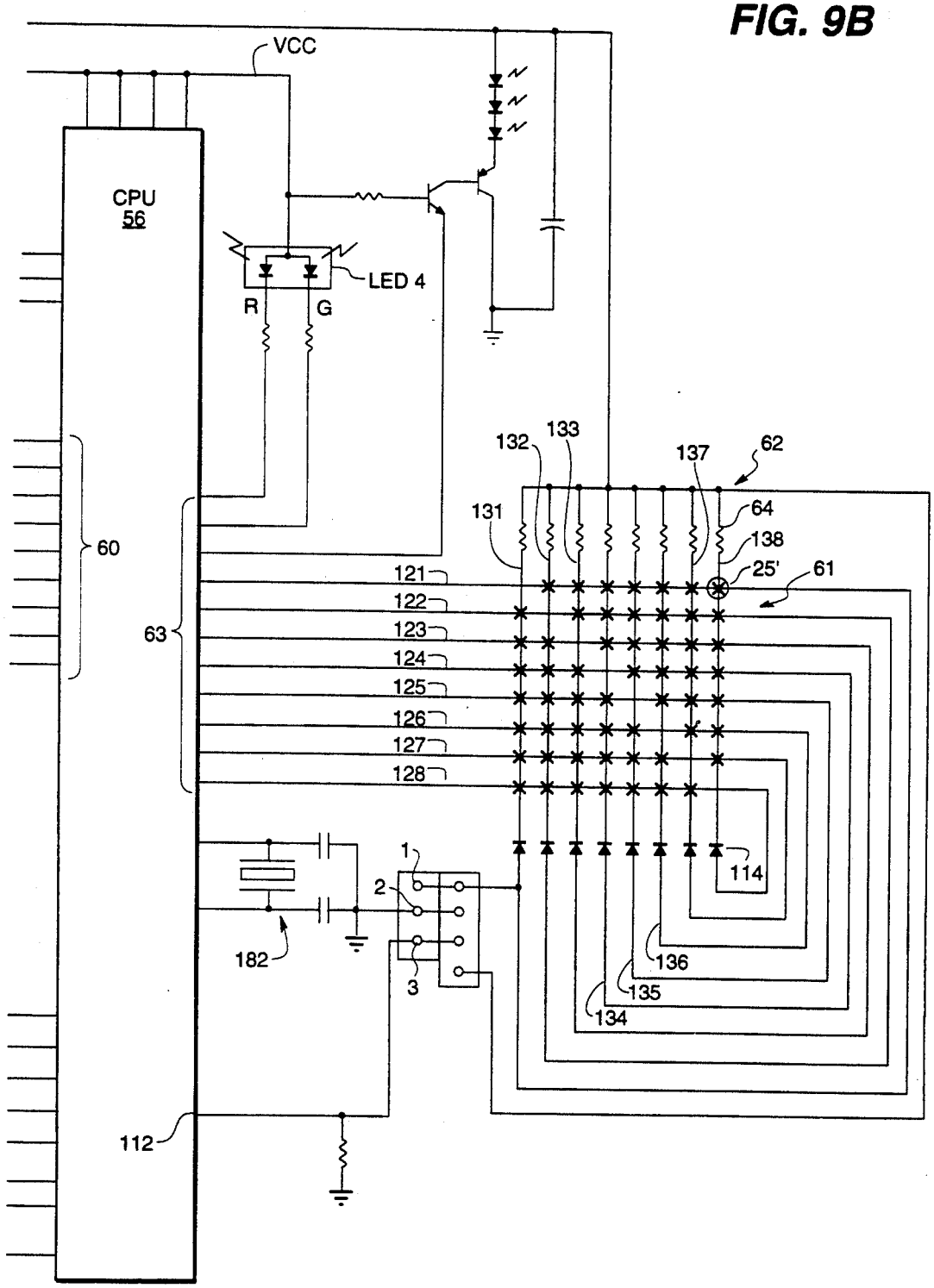

FIGS. 9A and 9B are a detailed schematic circuit diagram of the operating circuitry 42. The operating circuit 42 includes the central processing unit 56, the latch 58, the random access memory 54 and LED 1, LED 2, LED 3 and LED 4.

The operating circuitry also includes several subcircuits. One of those subcircuits 62 (FIG. 9B) includes the keyboard 61 having pushbuttons 25, each of which is connected to a port 63 of the CPU 56 shown in FIG. 9B and can be referred to as the keyboard circuit 62. The X's in FIG. 9B indicate the pushbuttons 25 and when one of those pushbuttons X is pressed, current flows through a resistor in a column line, e.g., when button 25' is pressed current flows through resistor 64 in column line 138 going to the button or key 25'. That raises the voltage on a supply line VCC to the CPU 56 of the microprocessor.

Accordingly, whenever a button 25 is pressed, it will increase the voltage on line VCC which initiates a switching process in a wake up circuit 70 for "waking up" or energizing the CPU 56 in the manner described below.

In addition to the keyboard circuit 62 and the wakeup circuit 70, the subcircuits include a reset circuit 74, and a write protect circuit 78.

When the voltage on line VCC goes up, a signal is passed through capacitor 102, to the base of a transistor 104 in the wake up circuit 70. This turns on the transistor 104 which in turn turns on transistor 106. This turning on of the transistors 104 and 106 will bring voltage on line VCC to the full DC voltage of about 5½ volts. When the voltage on line VCC reaches 5½ volts, the CPU 56 begins to operate.

When operating, the CPU 56 establishes a signal on line ALE 108 which is passed through a resistor 110 and filtered by capacitor 102. Once the ALE signal is established, it causes a voltage to be generated at the base of transistor 104, maintaining transistor 104 turned on, which in turn maintains transistor 106 turned on, thus enabling the CPU 56 to continue to run. The CPU 56 can turn itself off by executing a HALT instruction which causes the ALE signal to cease, thus turning off transistors 104 and 106 and removing power via line VCC to the CPU 56.

It is to be noted that the wake up circuit 70 can be activated by depression of a key or button 25 or by an input signal at serial port 3. coupled to an input port 112 of the CPU 56.

The circuit elements described above form the wakeup circuit 70 for activating the operating circuitry 42 of the device 10. This circuit uses substrate static-protection diodes 114 in a CMOS chip coupled to the keyboard 61. With this arrangement, source current is supplied to transmitter 104 via line VCC when a key or pushbutton 25 is depressed.

The RAM 54 is connected to the lithium battery 52 and, when the device 10 is not being used, draws about 20 nanoamps from the battery 52, which gives the device 10 a shelf life between 5 and 10 years. A backup capacitor 116 is coupled to the RAM 54 and has (at 20 nanoamps) a discharge time of about 10 minutes, providing ample time to change (if necessary) the battery 52 without losing the instructions and data stored in the RAM 54. Capacitor 116 is kept charged by battery 46 through diode 117 when the device 10 is operating and, at other times, by battery 52 through diode 118.

After the CPU 56 has been powered up, or awakened, the CPU 56 makes a scan of row lines 121-128 to the keyboard 61 by sequentially forcing each line 121-128 low and then polling the other lines to find out which button 25, such as button 25', has been pressed. As a result of pushbutton 25' being pressed, a low impressed upon row line 121 will cause a low on column line 128 and that will result in the row line 128 being low.

The CPU 56 first sets row line 121 low and then begins scanning, starting with the row line 122, for another row line having a low voltage thereon and by finding the row line with the low voltage, in the above example, row line 128, the CPU 56 knows that button 25' at the intersection of row line 128 and column line 138 has been depressed.

If the CPU 56 had not found a low on another row line, such as row line 128, after having set line row 121 low, line 121 is returned to its previous value and row line 122 is then set low, and the scan continued until a low row line is found to identify which button 25 has been depressed.

When the CPU 56 determines which pushbutton 25 has been depressed the CPU 56 will then know what function is to be carried out.

It is to be noted that the keyboard circuit 62 is uniquely designed to include only eight (8) row lines 121-128 and eight (8) column lines 131-138 each having a resistor 64 and a current directing diode 114 therein and each being arranged across the row lines 131-138 so that 56 switch positions are provided with only eight (8) lines.

All memory cycles exercised must involve the latch 58 because the CPU 56 has its data bus multiplexed with the lower 8 bits of the address bus on lines 141-148.

Coming out of the CPU 56 to the latch 58, is a group of nine (9) lines 108 and 141-148. One of the lines, line 108, carries the ALE signal. The eight (8) lines 141-148 between the latch 58 and the CPU 56 are the multiplexed data and address bus lines. These lines comprise the lower 8 bits of the address bus. A group of multiplex lines are identified with reference numeral 150. Five more lines 151-155 comprise the upper five bits of the address bus, making a total of 13 bits of address.

An inverting OR gate 156 having an output line 158 and two input lines 160 and 162 together with ground line 164 are coupled between the CPU 56 and the RAM 54. The line 158 defines an output enable for the RAM 54.

Accordingly, when the CPU 56 wants to do a read, it actuates either of the two input lines 160 or 162 going into the OR gate 156. Line 160 is a PSEN line for telling the RAM 54 that it is to be enabled to receive data and line 162 is a Read Output line to tell the RAM 54 that the CPU is going to read the information stored in the RAM 54. With OR gate 156 the two lines and functions are combined on one line 158. In other words, the CPU 56 tells the RAM 54, through the OR gate 156, that it wants to read information stored in the RAM 54.

The circuitry 42 also includes the write protect circuit 78 which has the double duty of being a low battery indicating circuit. The circuit 78 includes a resistor 170, a transistor 171, two resistors 172, 173 and a Zener diode 174 connected as shown.

A write enable line 176 is connected between the transistor 171 and the CPU 56.

When the CPU 56 desires to write information into the RAM 54, it places the address on the address bus lines 141-148 and 151-155, strokes the lower 8 bits of the address bus on lines 141-148 into the latch 58 using ALE line 108, places the information on the data bus lines 141-148, and then brings the write enable line 176 low.

When the write enable line 176 goes low, unless the transistor 171 is turned on by virtue of the battery voltage being more than 4.3 volts, a line 178 going into the RAM 54 at the collector 180 of the transistor 171 (which is the "write enable" for the RAM 54), is prevented from going low, maintaining the RAM "Write Protected". This condition also is created when the battery 48 is low. The "write enable" line 176 also functions as a low battery detector because, during execution of the program, a check is made to see whether writing to the RAM 54 is enabled. If it is not, this shows that the batteries are weak and a signal is sent to the user by flashing the red LED, of LED 4, 5 times.

Note that LED 4 includes a red LED and a green LED incorporated into one package so that when both LEDs are turned on, a yellow light is emitted, making LED 4 a tricolor LED. Such tricolor LED 4 enables the device 10 easily to communicate to the user by way of the color, number and sequence of light blinks.

A clock circuit 182 including a crystal resonator is coupled to the CPU 56.

Three serial ports 1-3 are coupled to the CPU 56 and include port 1 which is a transmitting port, port 2 which is ground and port 3 which is a receiving port. Serial port 1 is connected to row line 121 so that data can be serially transmitted in the form of highs and lows by CPU 56 from the RAM 54 over row line 121 to serial port 1. Incoming data is received serially at serial port 3 and conveyed to input port 112, when it is desired to update the code data and/or instructions in the RAM 54.

The three infrared-emitting LEDs, LED 1, LED 2, and LED 3 are connected in the circuitry 42 as shown.

The reset circuit 74 includes two resistors and a capacitor connected as shown and coupled between line VCC and a reset line 184.

As will be described in greater detail in connection with the description of FIGS. 11-14, the manufacturer of the device 10, using known methods or the method described herein with reference to FIGS. 12A-13C, will decipher the infrared codes for operating various pieces of equipment, such as a TV, a VCR, a CD, a Cable Converter or other equipment which is controlled by a remote infrared transmitting device.

After the infrared code is deciphered, the code data therefor and instructions for generating such code (see the flow chart in FIG. 14) are stored in a programming computer 200 (FIG. 10) and the device 10 is programmed as explained below.

It is to be noted that the circuitry 42 has no ROM and all instruction codes and code data are loaded directly into the RAM 54. This allows for infinite upgradability in the field via the serial ports 1, 2, 3.

Figure 10:
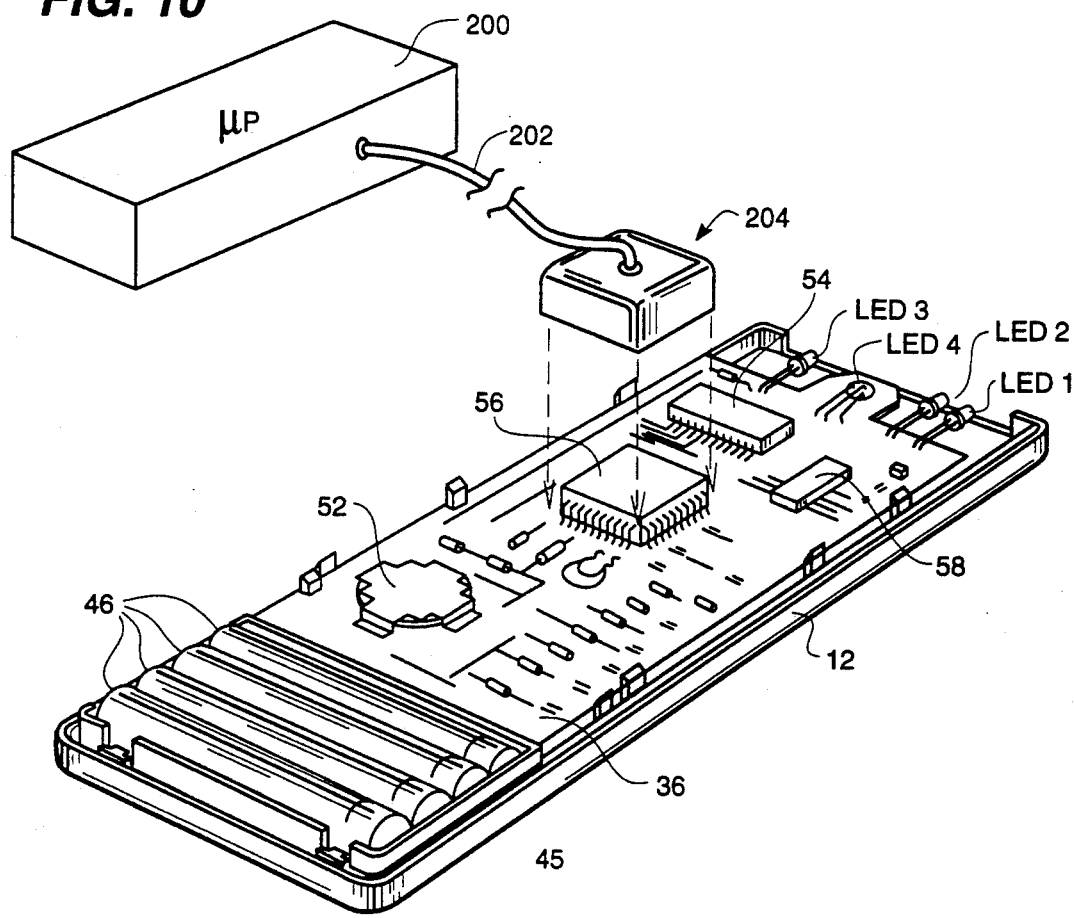
FIG. 10 is a perspective view showing the connection of a programming connector over the central processing unit of the operating circuitry in the control device, the programming connector being connected to a microprocessor, being operable to disable the central processing unit, and being used to program the random access memory (RAM) of the operating circuitry.

FIG. 10 is a perspective view of a programming computer 200 coupled by a cable 202 to a special connector 204 which is adapted to be received over the CPU 56 in the operating circuitry 42 for disabling the CPU 56 and for enabling the RAM 54 to be programmed by the programming computer 200. Essentially this is done by tri-stating the CPU 56 and placing the RAM 54 into the address space of the computer 200 which writes initial instruction code including code for the serial port driver, and subsequently serially, other instruction code and code data into the RAM 54. For this purpose the programming computer 200 has instruction codes such as serial port driver instructions and data relative to the infrared codes for operating a multiple number of electronic apparatus, such as televisions, VCR's, etc stored therein. Signals from the programming computer 200, via the connector 204 cause the inputs and outputs 60 of the CPU to be disabled so that instruction codes and data can be input into the RAM 54 quickly and efficiently from the programming computer after the operating circuitry 42 is mounted in the control device 10.

Figure 20:
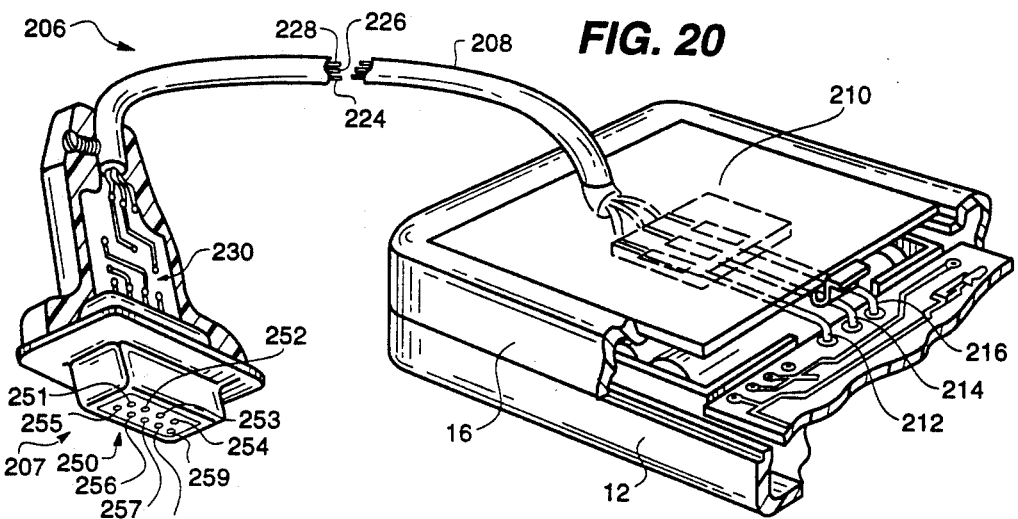
FIG. 20 is a fragmentary perspective view with portions broken away of a connector with conversion circuitry therein and a special battery case cover for the control device by which new data can be inputed into the RAM of the operating circuitry of the control device.

Later, after the device 10 has been in use for some time and the RAM 54 needs to be updated with instruction codes and data relative to new equipment on the market, the control device 10 can be simply and easily updated at a service outlet having an ordinary personal computer with a serial port using a novel nine pin to three pin, 9 volt to 5 volt, signal coupling and converting assembly 206 (FIG. 20). The updating can be done by adding to the data in RAM 54 or by rewriting (writing over) the data in RAM 54. The assembly 206 is described in greater detail hereinafter in connection with the description of FIGS. 20-22.

The infrared codes to be learned include a wide range of different codes for operating different electrical apparatus manufactured by the same or different manufacturers. In FIG. 11, which is identical to FIG. 1 in U.S. Pat. No. 4,623,887, there are illustrated several modulation schemes for infrared carrier frequencies. Typical carrier frequencies for infrared remote transmitters are 20 Khz to 45 Khz, with the majority being at 38 Khz and 40 Khz. The gating schemes illustrated include both fixed and variable bit periods, non-return to zero (NRZ), variable burst widths, single/double burst modulation schemes, and a final catch-all category called random because there is no readily distinguishable pattern of ones and zeros.

In addition to these schemes, there is also a transmitter which puts out a different continuous frequency (CW) for each key as represented in FIG. 11h.

Finally, several new types of transmitters do not use a carrier frequency at all but instead send a stream of pulses where the data is encoded in the spaces between the infrared pulses as shown in FIG. 11i.

Data modulation schemes for most transmitters have a higher level of data organization which may be called a keyboard encoding scheme which causes different data to be sent depending upon the transmitter and the key pressed. This will be described in greater detail hereinafter in connection with FIGS. 15-19.

The code data for the infrared codes may be obtained from vendor information sheets and specifications, can be determined using the method disclosed in U.S. Pat. Nos. 4,623,887 and 4,626,848, or by the method disclosed herein.

In the method for learning or acquiring code data for infrared codes disclosed herein, no counting of pulses is carried out. Instead the method involves the following steps:

(a) receiving a transmission of a train of pulses from a remote control transmitter;

(b) recording the point-in-time of an edge of each pulse in a train of the pulses;

(c) transforming the recorded point-in-time data into a list of instructions for generating a replica of the train of pulses;

(d) timing the duration of a train of the pulses;

(e) timing the period between trains of pulses;

(f) associating a function 7 key of the universal remote control device 10 with the time duration of the train of pulses and the list of instructions for generating a replica of the train of pulses;

(g) determining whether or not repetitions of the transmission of train of pulses is present;

(h) ignoring repetitions of the train of pulses;

(i) noting that repetitions are present; and (j) storing for use in a universal remote control device, the information acquired in steps (c), (d), (e), (f) and (i).

Typically, each pulse has a fixed duty cycle and in carrying out the above described method it can be assumed that each pulse has a fixed duty cycle.

Figure 12A:
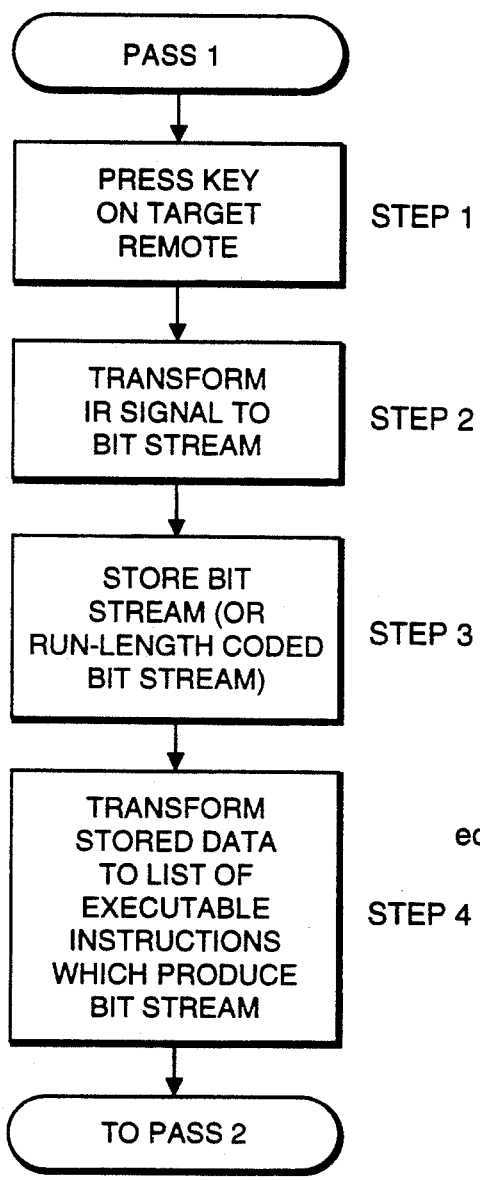
FIG. 12A is a flow chart of a first part of a method for capturing an IR code and FIG. 12B is a graph of the envelope of the code.
Figure 13A:
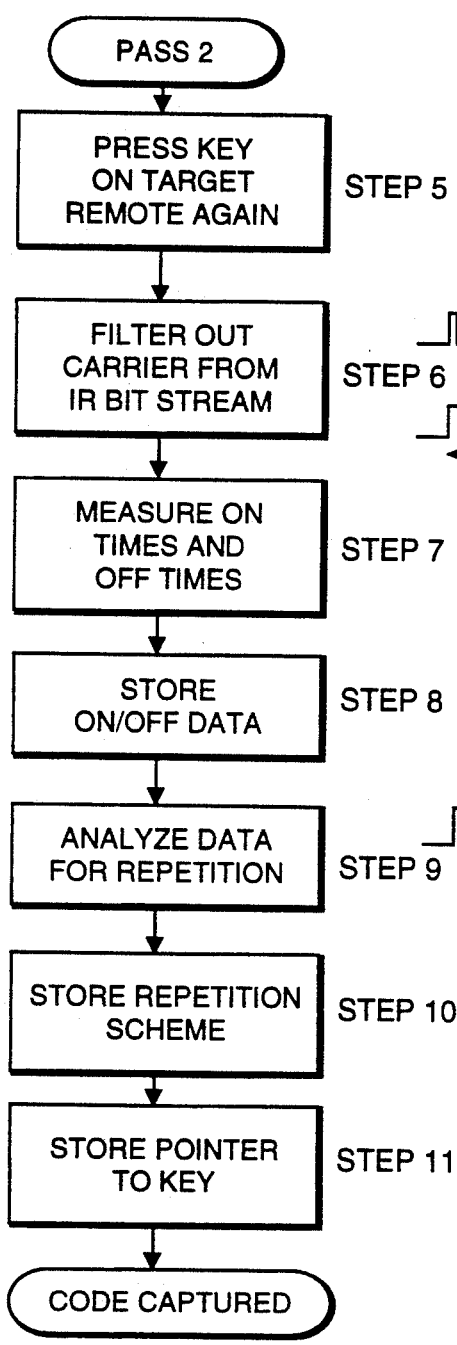
FIG. 13A is a flow chart of a second part of a method for capturing an IR code.

The manual and computer steps followed in practicing this method are set forth in FIGS. 12A and 13A.

Figure 12B:
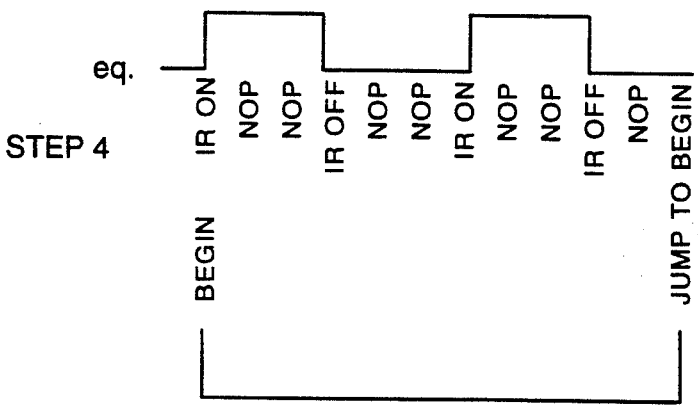

FIG. 12A is a flow chart of the first part of this method for capturing an IR code and FIG. 12B is a graph of a pulse train comprising a portion of the code.

There is shown in FIG. 12B, adjacent the transforming step in FIG. 12A, a graph of the waveform of the captured, and later recreated, infrared codes, showing when the infrared signal is on and when it is off. When the CPU 56 executes the instructions set forth below the waveform in FIG. 12B, infrared-emitting LEDs, LED 1, LED 2, and LED 3 are turned on when the instruction IR-ON is executed and turned off when the instruction IR-OFF is executed. No operation is performed when the instruction NOP is called for. In this way the infrared codes are transformed into a bit stream of 0's and 1's.

FIG. 13A is a flow chart of a second part of the method for capturing an IR code.

Figure 13B:
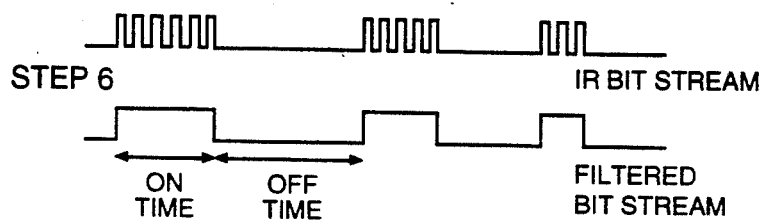
FIG. 13B is a waveform of the IR bit stream and filtered bit stream.

FIG. 13B shows the IR infrared bitstream and an envelope of the filtered bitstream.

Figure 13C:
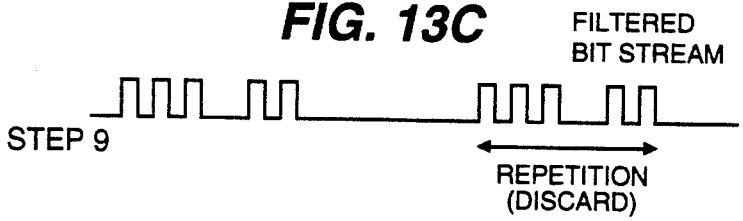
FIG. 13C is a graph of the waveform of a filtered repetition of a filtered bit stream.

FIG. 13C shows the filtered waveform that is analyzed for repetition. The repetition scheme and a pointer to indicate, upon regeneration of the infrared code, which key will generate that code are stored in a memory for later inputting into the RAM 54.

Figure 14:
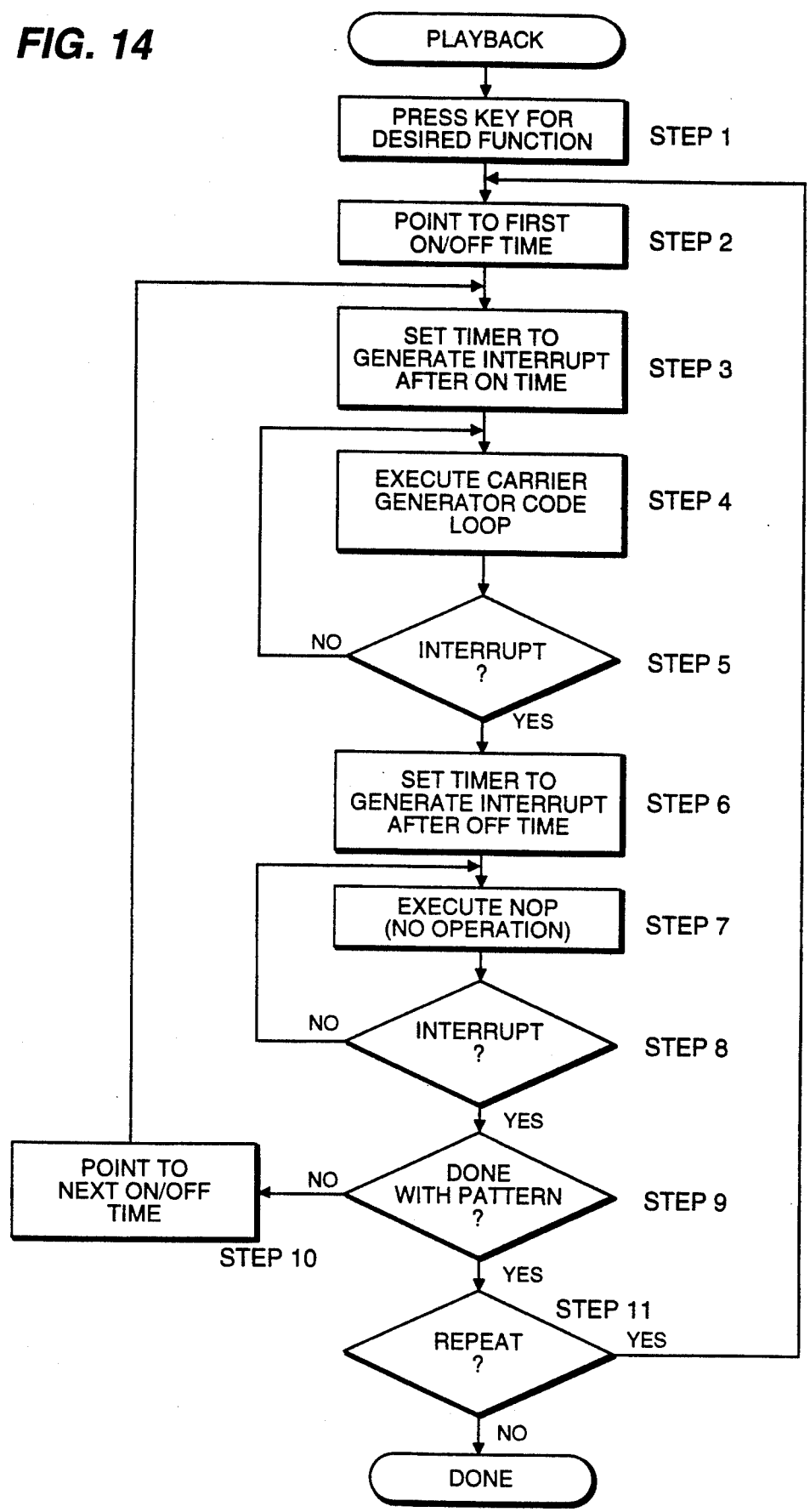
FIG. 14 is a flow chart of the method used for generating an infrared code.

FIG. 14 is a flow chart of a sequence of eleven (11) steps that a user initiates to generate a specific IR code for performing a specific function, namely, for generating a captured IR code stored in the remote control device 10. The code data is stored in the RAM 54 of the remote control device 10 and the sequence of steps the circuitry 42 goes through to take the code data in the RAM 54 and generate the infrared code therefrom is set forth in this Figure.

FIG. 15 is a plan view of the keyboard 61 and shows the different keys or pushbuttons 25 of the control device 10 extending through the base panel 14 of upper housing member 12 and the face panel 18 where the label or identification for each pushbutton or key 25 is shown. The light emitting diode, LED 4, is also indicated.

FIG. 16 is a flowchart of the steps initiated by a user of the device 10 in a step and set procedure for searching for code data in the device 10 for the infrared code needed to operate the user's specific apparatus and to set the device 10 for that code data.

FIG. 17 is a flow chart of the steps initiated by a user in carrying out a direct-entry/quick-set procedure for matching the user's equipment or apparatus to the device 10.

The steps of this procedure include:

STEP 1. Look up make and model number of the controlled apparatus in a table provided to the user in an instruction booklet.

STEP 2. Model number is found and matched with a series of 8 "R"s and "G"s.

STEP 3. Here the operator presses the desired mode button or key.

STEP 4. Press DO, Enter. Recall. This tells the device 10 to do a Quick-Match.

STEP 5. Next enter the sequence of eight red and green blinks found in TABLE I (set forth below) provided in the instruction booklet. This is done by pressing Channel Down for "R" and Channel Up for "G".

STEP 6. Here a determination is made if a key other than Channel Up or Channel Down was pressed.

STEP 7. The device 10 tricolor LED 4 will flash red or green depending on what button is pushed.

STEP 8. When all eight codes are entered, the program goes on to STEP 9.

STEP 9. Here a check is made to see if the blink code is in the table in the RAM 54 of the remote control device 10.

STEP 10. If the device 10 has successfully Quick-Matched to the controlled apparatus, the LED 4 will flash green twice.

STEP 11. If it did not match, it will flash yellow indicating that codes for that controlled apparatus are not loaded into the RAM 54.

TABLE 1

| Blink Code | DEVICE BLINK CODES AND SPECIAL FEATURE BUTTONS | | | | | | | |
|---|---|---|---|---|---|---|---|---|
| | A | B | C | D | E | F | G | H |
| | TELEVISION SETS | | | | | | | |
| RRRR RRRR | Display 25 = Col Up | MTS 26 = Col Dn | Pict+ 27 = Brt Up | Pict− 28 = Brt Dn | Sleep 29 = Hue Up | TV/Video 30 = Hue Dn | Ant 31 = Mtx | Tone 32 = Reset |
| RRRG RRRG | Screen Dn | Sp Phne/ Prnt Ctl | AutoOn Data Ent | AutoOff/ Data Clr | Ant | Stereo | | |
| RRRG RGRG | Add | Clear | | | | | | |
| RRRG GRRR | A Ch | Hi Fi | | | | | | |
| RRRG GRGR | Ant/Aux | Time/Ch | Program | TV/VCR | | | | |
| RRRG GGGR | Ant/Aux | Time/Ch | | | | | | |
| RRRG GGGG | Pwr On | Pwr Off | Display | Ant | | | | |
| GRRG RRRG | Aux | Last Ch | Timer | | | | | |
| GRRG RRGG | Fine Up 25 = Stereo | Fine Dn 26 = TimeFa | L Ctl 27 = Timer | R Ctl 28 = TimeS1 | OBC 29 = TV/AV | Func | Review | BiLing |
| GRRG RGRR | Fine Up 25 = Stereo | Find Dn 26 = TimeFa | L Ct 27 = Timer | R Ctl 28 = TimeS1 | OBC 29 = TV/AV | Func | Review | BiLing |
| GRRG RGGR | Tint R 24 = SAP 32 = Ext 1 | Tint L 25 = Reset 33 = Ext 2 | Color R 26 = Q/V 34 = Ant | Color L 27 = EXP | Contr R 28 = Disp | Contr L 29 = Mono | Timer 30 = Lock | Stereo 31 = TV |
| GRRG GRRG | TV/Video | Time | | | | | | |
| GRRG GRGR | TV/Video 25 = Timer | Wide 26 = 100 | Lvl Up 27 = BiLing | Lvl Dn | Memory | Func | MTC | Stereo |
| GRRG GRGG | 10 | 11 | 12 | 13 | | | | |
| GRRG GGRR | RF12 26 = 100 34 = Pict | Ch Rtn 27 = Audio 35 = Reset | Str SAP 28 = CCC1 | Mono 29 = CCC2 | Timer 30 = CCC3 | T Set 31 = CCC4 | TV/CATV 32 = ContDn | TV/Vid 33 = Cont Up |
| GRGG RRRR | Sleep | Review | | | | | | |
| GRGG RRRG | K | L | | | | | | |
| GRGG RRGR | SAP | Sleep | TV/Video | | | | | |
| GRGG RRGG | Program | Q Rev | SAP | Sleep | TV/Video | Add | Delete | |

TABLE 1-continued

DEVICE BLINK CODES AND SPECIAL FEATURE BUTTONS

| Blink Code | A | B | C | D | E | F | G | H |
|---|---|---|---|---|---|---|---|---|
| GRGG RGRG | Sleep | St/SAP | TV/Video | | | | | |
| GRGG RGGR | 11 | 12 | 13 | 14 | 15 | 16 | | |
| GRGG RGGG | K | L | | | | | | |
| GRGG GRRR | K | L | | | | | | |

VIDEO CASSETTE RECORDER

| Blink Code | A | B | C | D | E | F | G | H |
|---|---|---|---|---|---|---|---|---|
| RRRR RRRR | Nse Cncl | | | | | | | |
| RRGR RRRG | Ant | | | | | | | |
| RRGR RRGR | Ant | | | | | | | |
| RRGR RRGG | Frm Adv | Slow | Slow Up | Slow Dn | Srch Fwd | Srch Rev | | |
| RRGR RGRR | A | B | C | D | E | F | | |
| RRGR GGGR | Slow | | | | | | Slow | |
| RRGR RGGR | Slow+ 28 = Shift | Slow− 29 = Reset | Eject 30 = Mem/PS | CM Skip 31 = SR | Program | Input | Mode | AM/PM |
| RRGR RGGG | Forward | FlshBack | Ant | Vol+ | Vol− | Reverse | Sp Phne | PC |
| RRGR GRRR | Ant/Aux | | | | | | | |
| RRGR GRRG | 11 | 12 | 13 | 14 | 15 | 16 | | |
| RRGR GRGR | Frm Adv | Memory | Reset | Chg Time | | | | |
| RRGR GGRR | Pwr On | Pwr Off | | | | | | |
| RRGR GGGG | Slow 29 = Frame 37 = Clock | Slow Up 30 = Memory 38 = APS | Slow Dn 31 = Prog 39 = 100 | Set Up 32 = Qtr | Set Dn 33 = QtrStr | Timer 34 = Quick | Clear 35 = Remain | Display 36 = Rst |
| GGRG RRRR | K | L | | | | | | |
| GGRG RRRG | CFM | Slow | | | | | | |
| GGRG RRGR | Slow 28 = Timer | OSP | Shift L | Shift R | Slow Dn | Slow Up | St+ | St− |
| GGRG RRGG | 11 | 12 | 13 | 14 | 15 | 16 | Slow | |
| GGRG RGRR | Slow Dn | Slow Up | Slow | | | | | |

CABLE CONVERTERS

| Blink Code | A | B | C | D | E | F | G | H |
|---|---|---|---|---|---|---|---|---|
| RRRR RRGR | A/B | Add | Delete | Set | Lock | Last Ch | | |
| RRRR RRGG | A 25 = F | B 26 = K | Event(*) 27 = Learn | # 28 = PGM | Arrow Up 29 = TCP | Arrow Dn 30 = Enter | AP | Delete |
| RRRR RGRR | Skew L | Skew R | Audio | SAT | Ant East | Ant West | | |
| RRRR RGRG | Plus 22 = C/R | Minus 23 = # | Dot | Box | Str | Clear | Time | Auth |
| RRRR RGGR | Prog | Auth | | | | | | |
| RRRR RGGG | Auth | | | | | | | |
| RRRR GRRR | Auth | Prog | | | | | | |
| RRRR GRRG | Plus | Minus | Rcp | * | M1 | M2 | M3 | M4 |
| RRRR GRGR | A-B | Dot 1 | Dot 2 | * | Am | Dm | F | |
| RRRR GRGG | Arrow Up | Arrow Dn | | | | | | |

COMPACT DICK PLAYERS

| Blink Code | A | B | C | D | E | F | G | H |
|---|---|---|---|---|---|---|---|---|
| RRRR RRRR | CD Fwd | CD BckUp | | | | | | |
| GRRG GRGG | Fwd Indx | Rev Indx | Repeat | Memory | | | | |

*For numbered functions, press "DO" then the two-digit number.

Figure 18A:
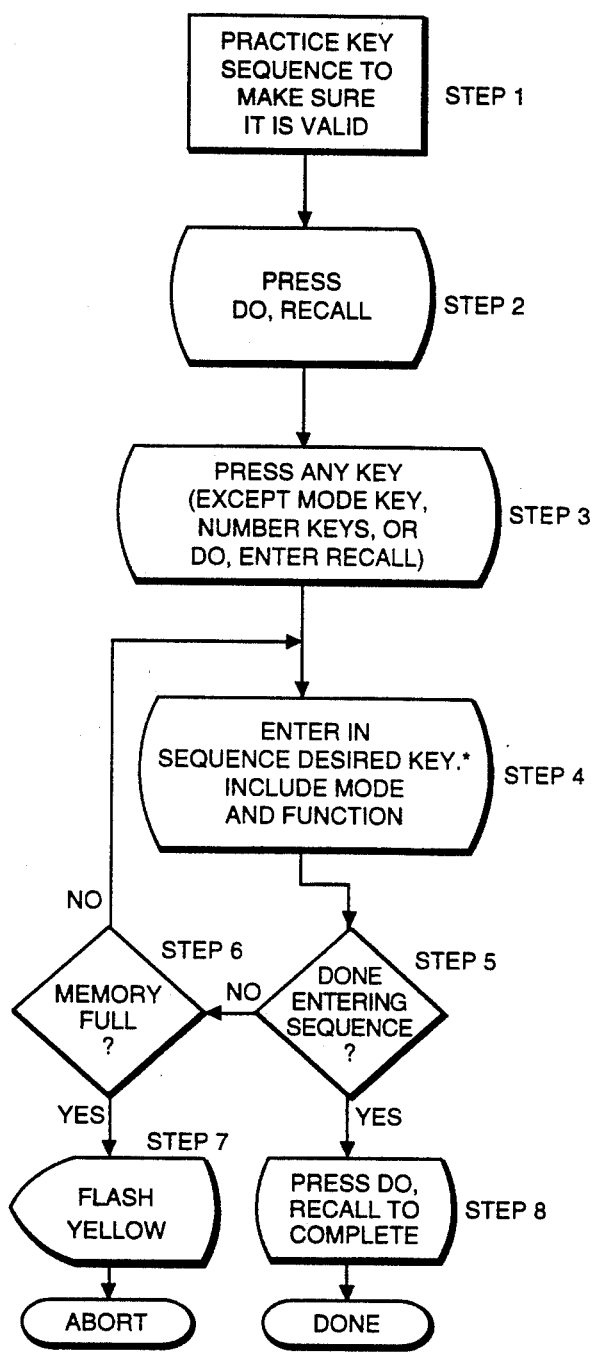
FIG. 18A is a flow chart of the procedure followed in setting a "DO" command and FIG. 18B is a flow chart of the method for executing a "DO" command.

FIG. 18A is a flow chart of the steps for setting a "DO" command macro, for achieving a function that normally requires the actuation of several buttons, by programming one particular button to perform the functions required of the several buttons to achieve a specific function.

Figure 18B:
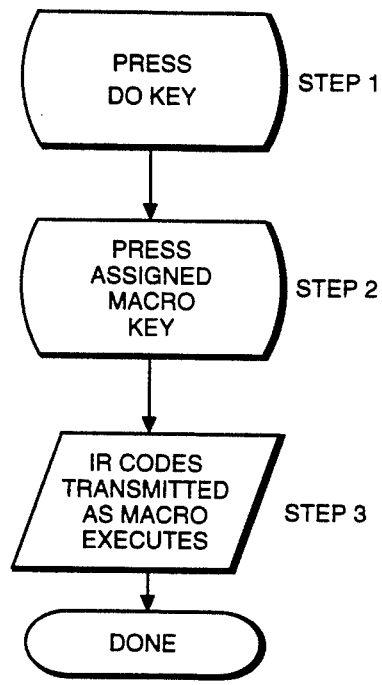

FIG. 18B is a flowchart of the simple two pushbutton steps required for executing the "DO" macro command created in FIG. 18A.

Figures 19A, 19B:
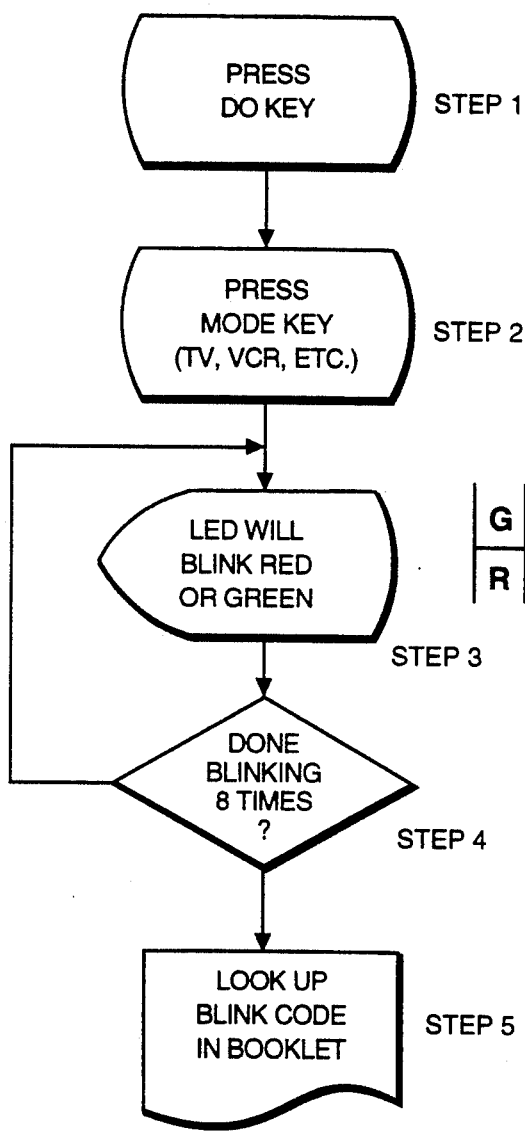
FIG. 19A is a flow chart of the method used to identify what type of unit the remote control device is set for and FIG. 19B is a table of the identifying blink code.

FIG. 19A sets forth the steps initiated by a user to determine the various blink codes which identify what equipment or apparatus the remote control device 10 is set for.

FIG. 19B illustrates a sample blinking grid of eight red and green blinks which will be presented to the user. Once a particular pattern of eight red or green blinks has taken place, the user of the device 10 will look up the blink pattern or code in TABLE I included in a user handbook. This table shows the user which pushbuttons 25 labelled A-H are associated with additional functions stored which may be stored in the RAM 54. Additional functions beyond the eight supported by pushbuttons AH are performed by pushing "DO", and then the two-digit sequence shown in TABLE I.

The instructions for using the control device 10 which are supplied to a purchaser thereof in an instruction booklet are set forth below.

Matching the Device to Your Equipment

The device 10 can contol most remote controlled TV's, VCR's, cable converters, and CD players, but it needs the user's input to match it to your particular equipment. The easiest way to do this is to STEP-and-SET your device 10. You will only need to do this once for each different type of device you have.

1. To STEP-and-SET your device 10, first press DO, Enter.

2. Press one of the following equipment selection buttons to tell the device 10 what kind of equipment to match.

VCR1  Cable  TV
VCR2  CD

3. Aim the device 10 at the equipment and try various function buttons to see if the equipment responds correctly. Make sure you are reasonably close to the equipment and that nothing is blocking the path. The light (LED 4) at the top of the device 10 will shine green whenever it is sending an infrared code, or it will not light at all if it does not send a code for a particular button.

4. If your equipment did not respond correctly or did not respond at all, press DO1 to change the device 10 so that it will send the next set of infrared codes in its library, or press DO2 to change it so it will send the previous set of codes.

5. When you use DO1 or D02 to step the device 10 setting forward or back, its light will blink yellow each time you step it. The settings step around in a circle. Whenever you get back to the setting where you started the device 10 light will blink red to notify you.

6. Use DO1 and DO2 to step through the sets of codes and keep trying out functions until your equipment responds correctly. The device 10 will then be set to send the proper infrared codes for operating your particular equipment.

7. When you are satisfied that the device 10 is properly matched, press DO, or any of the equipment selection buttons to restore the DO1 and D02 buttons to their normal functions.

8. If your equipment is responding to your device 10 but some buttons are causing the wrong thing to happen, keep going. Some equipment responds to the infrared codes of other brands of equipment.

9. If you try out all of the codes in the device 10 library and your equipment still does not respond, it is probably because the code data for generating the infrared codes for operating your equipment is not in the library of your control device 10. The Keyboard 61

Take a look at the keyboard. There are four groups of buttons:

1. Equipment Selection Buttons tell the device 10 which equipment is to be controlled:

```
VCR1   Cable   TV
VCR2   CD
```

2. Basic Function Buttons are used to control your TV, VCR, CABLE and CD. They work in much the same way as in older remotes which typically have the following buttons.

| Rec. | TV.VCR | Stop | Power |
| --- | --- | --- | --- |
| Rewind | Reverse | Play | Pause |
|  |  |  | Fast Fwd |
|  |  |  | Mute |
| 1 | 2 | 3 | Vol.Up |
| 4 | 5 | 6 | Vol.Dn |
| 7 | 8 | 9 |  |
|  | 0 | Enter | Chan.Up |
|  |  | Recall | Chan.Dn |

3. Extended Function Buttons perform any special functions your equipment may have, such as color control, picture control, tint control, etc. These buttons are identified with the following alphabet letter.

```
A  C  E  G
B  D  F  H
```

4. DO Buttons are used to perform very powerful DO Commands which are explained below.

Special Features

Besides the basic functions such as channel up/down and volume up/down that most TV remote controls have, there could be special features as well, for example:

Color up/down.
Picture up/down.
Tint up/down.
Sleep.

Your VCR's remote control can also have special features such as:

Frame advance
Channel up/down

Your cable converter remote control can also have additional features such as:

Channel recall
Delete

Your CD player remote control can have special features such as:

Repeat
Track programming

Once you have matched the device 10 to your TV, VCR, Cable Converter and CD player, all functions that were controlled by your old remote control devices can now be controlled by the device 10. You may even notice some extra features that weren't controlled by your old remote.

Since the device 10 can control such a wide range of equipment, there is not enough room on it for buttons for every possible feature of every remote control. Instead, there are eight extended function buttons at the bottom labelled A through H. To find out what these eight buttons control for your particular TV, VCR, cable converter and CD player:

1. Get your pen and paper ready.
2. Press DO and then the button (TV, VCR1 VCR2 Cable CD).of the device you want to know the special features of.
3. The device 10 will blink "red" or "green" 8 times. Every time it blinks "red" write down an "R". Every time it blinks "green" write down a "G". When you're finished writing it should look something like this:

R R R G R R R G

This is the "Blink Code" for your device. If you miss it the first time around, just press DO and the device button a second time.

4. Look at TABLE I and find the sequence of "R"s and "G"s that matches the one you wrote down.

5. Read the special features chart next to your Blink Code sequence which tells you what functions the A through H buttons control for your particular device.

For example, the feature chart of your TV might read:

| A: Color Up | C: Picture Up |
| --- | --- |
| B: Color Down | D: Picture Down |

6. To turn the color up in this example, you would press TV (of course if the device 10 is already set to control your TV, you do not have to press TV again but it doesn't hurt if you do so), then A.

7. To turn the color back down, you would just press B.

8. Write down what special functions are controlled by the A through H buttons on the handy stick-on labels enclosed with the control device 10.

9. After writing down the special functions on the labels, stick them on to the back of the control device 10 for quick and easy reference.

If The Controlled Equipment Has More Than 8 Extended Functions

Usually, the eight A through H buttons are enough for most controlled equipment. If they're not, don't worry. If your controlled equipment has more than eight special features these too are controlled by the device 10.

Beyond the A through H function buttons, any additional functions are performed by pressing DO then two of the 0-9 number buttons. For example, your TV's feature chart may show additional functions like these:

| 25: SAP | 26: Reset | 27: Q/V |
|---------|-----------|---------|
| 28: Display | 29: Mono | 30: Stereo |

If you did have these features and wanted to use them, you would press DO and then the two-digit number for that feature. For example, you might:

Press DO,3,0. This would turn your TV's stereo broadcast feature on.

If you use a feature like this frequently you may want to assign it to a DO command, our next topic of discussion.

Setting DO Commands

DO Commands give you the power to perform a multitude of different functions with the push of just one or two buttons. DO Commands let you assign any of the following buttons to tell the device 10 to automatically perform a series of keystrokes you use often:

|  |  | DO1 | DO2 |
|---|---|---|---|
| Rec | TV.VCR | Stop | Pause |
| Rewind | Reverse | Play | Fast Fwd. |
|  |  |  | Mute |
|  |  |  | Vol. Up |
|  |  |  | Vol. Dn |
|  |  | Enter | Chan. Up |
|  |  |  | Chan. Dn |
| A | C | E | G |
| B | D | F | H |

To tell the device 10 to do what you want, you must teach it. As an example, you can teach the device 10 to turn your whole system on and set the TV to channel 4 by doing the following:

1. Press DO, Recall. This tells the device 10 that you want to teach it something to do.
2. Next, you must assign a button 25 you will use to DO whatever you teach it. You can use any of the device 10's buttons 25 set forth above. For example, let's use DO1 at the top of the keyboard: Press DO1.
3. Now, you must tell the device 10 what button sequence you would press to turn your whole system on and set the TV to channel 4.
4. Press TV Power. This tells the device 10 to turn your TV on.
5. Press 4, Enter (pressing Enter may not be required for your TV). This tells the device 10 to set your TV to channel 4.
6. Press VCR. Power. This tells the device 10 to turn your VCR on.
7. Press Cable. Power. This tells the device 10 to turn your cable converter on.

Now you have pressed all the buttons you want the device 10 to learn for this example.

8. Press DO. Recall. This tells the device 10 that you are finished teaching it and to remember what you have taught it.

Now the device 10 knows how to turn your TV, VCR, and cable converter on and set the TV to channel 4, just by pressing one button.

9. Aim the device 10 at your equipment and press DO1. Make sure you keep the device 10 pointed at your equipment while the light is flashing.

Now that you know how DO Commands work, you can teach the device 10 to "DO" practically any sequence of keystrokes. Just remember to keep the following in mind:

To perform a DO Command, press DO then the button you assigned to remember the DO Command. However, if you assigned the DO1 or DO2 buttons to remember a DO Command, you do not have to press DO first, just press DO1 or DO2.

If the device 10 light (LED4) starts blinking green, yellow, red while you are trying to teach it, it is telling you that RAM 54 is full. The DO command you are teaching is automatically erased. You can teach the device 10 a shorter DO command, or erase some other DO command you have already taught the device 10 to obtain more memory space.

After the DO Command is finished, the last apparatus 10 selected within the DO Command will be the apparatus the device 10 will work with next.

Erasing a DO command

If you just want to change a DO Command, you do not have to erase it first—just set up the new DO Command in its place. However, to get rid of a DO Command without replacing it with a new one:

1. Press DO Recall.
2. Press the button you have assigned to the DO command that you want to erase. For example, to erase the DO command you taught the device 10 in the above example:

Press DO1.

3. Press DO, Recall again. The old Do Command is now erased.

QUICK- MATCHING To Your Equipment

There is a quicker way to match your equipment to the device 10 by Quick-Matching. Quick-Matching is a way to set the device 10 directly to match any controlled equipment in its library. Follow the steps below to do a Quick-Match:

1. Match the device 10 to your equipment using STEP-and-SET.
2. Press DO. then the desired device button (TV, VCR1, VCR2 or Cable. The device 10 light will blink red or green eight times.
3. Write down the sequence of red and green blinks. This is the "Blink Code" for the particular device.
4. Press DO Enter Recall. This tells the device 10 to do a Quick-Match.
5. Enter the correct sequence by pressing Ch Dn for "R" and Ch Up for "G". The device 10 light (LED 4) will flash "red" or "green" depending on what button you push. The Ch Dn and Ch Up buttons 25 are labelled with the correct color for each.

6. When the device 10 has successfully Quick-Matched your equipment it will automatically flash green twice. If it did not match, it will flash yellow. If it fails to Quick-Match, it is probably because the requisite code data is not stored in the library in your device 10.

QUICK-MATCHING Between Controlled Equipment

One of the great benefits of Quick-Matching is that you can switch the device 10 functions between the remote controlled TVs, VCRs and cable converters you may own. This is done by using "Quick-Match" within a "DO command".

Let's suppose you have two TVs in your house and only one device 10. Here's how to switch between them:

1. Press DO Recall. The button you want to use to switch to your other TV set.

For example, press DO2. This tells the device 10 that you want to teach it a DO Command.

2. Press DO Enter Recall. This tells the device 10 that you want to do a Quick-Match.

3. Enter the R and G blink sequence of the second TV you want to control by pressing Ch Dn for "R" and Ch Up for "G".

4. Press DO. Recall. This tells the device 10 that you are finished teaching it a "DO command".

Now, to set the device 10 to control your second TV, press DO2. This tells the device 10 that you will be controlling your second TV.

To go back to controlling your first TV, simply teach device 10 another "DO command". Just repeat the steps above, except use a different button and the correct R and G sequence for your first TV.

The device 10 can easily be taught to control a whole houseful of infrared remote controlled equipment—just teach the device 10 a DO Command to QUICK-MATCH each additional piece of equipment.

In FIG. 20 is shown a unique signal coupling and converting assembly 206 which includes a connector assembly 207, a cable 208 and a special cover plate 210 for the battery compartment 45. The cover plate 210 has on the underside thereof three pins 212, 214 and 216 which are positioned to connect with the three serial ports 1, 2 and 3. The pins 212, 214 and 216 mounted to the cover plate 210 are connected by three wire conductors 224, 226 and 228 in cable 208 to connector assembly 207 which has conversion circuitry 230 therein. The connector assembly 207 has a nine pin array 250 of sockets 251-259 for receiving nine pins and the conversion circuitry 230 which enables one to use some of the nine sockets 250 of the connector assembly 207 for communication with the three pins 212, 214, 216 that are connected to the serial ports 1, 2 and 3 as shown in FIGS. 21 and 22.

Figure 21:
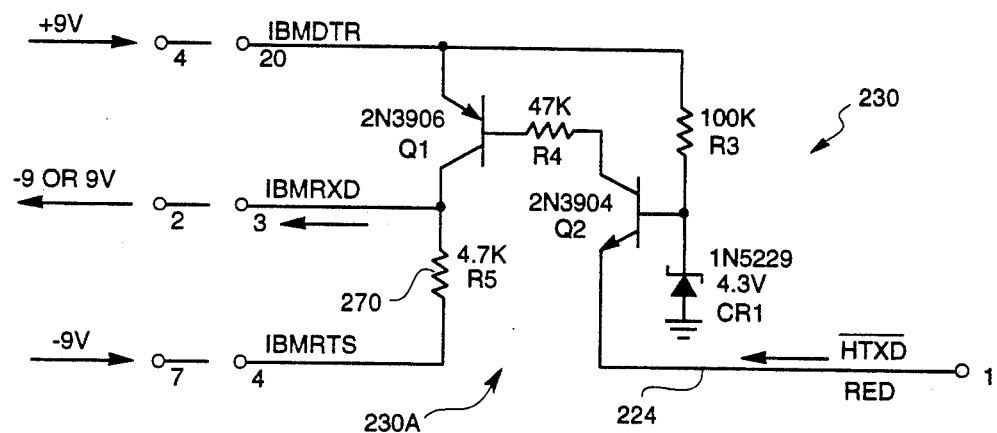
FIG. 21 is a schematic circuit diagram of part of the conversion circuitry in the connector shown in FIG. 20.
Figure 22:
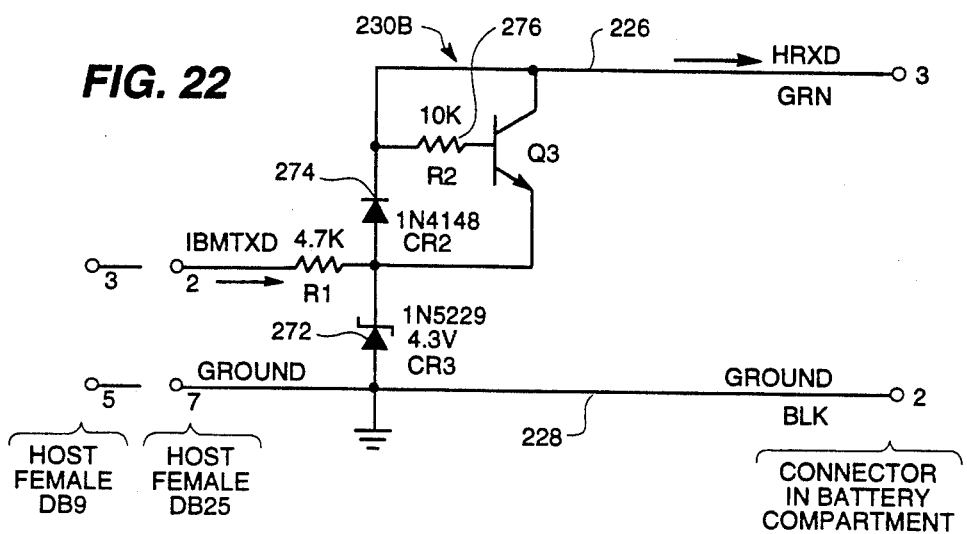
FIG. 22 is a schematic circuit diagram of another part of the conversion circuitry in the connector shown in FIG. 20.

FIGS. 21 and 22 are a schematic diagram of the conversion circuitry 230.

In FIG. 21 is shown circuit portion 230A. In this circuit portion, plus nine volts goes into pin 4 of connector DB-9 or pin 20 of connector DB-25 and minus 9 volts goes into pin 7 of DB-9 or pin 4 of connector DB-25, which are connected to the circuit portion 230A of the conversion circuitry 230. This provides a constant source of positive and negative voltage and is used as the power supply for the circuit. Note that two different types of personal computer host female connectors can be used, namely, female connector DB-9 or female connector DB-25 in the connector assembly 207.

Serial information is transmitted by the hand held control device 10 via line HTXD at serial port 1 and is level translated by the operating circuitry 42 from a range of from plus 5 volts to zero volts to a range of from minus 9 volts to plus 9 volts.

In this respect, when 0 volts is present at serial port 1, transistors Q1 and Q2 are turned on such that +9 volts is supplied from pin 4 of connector DB-9 or pin 20 of connector DB25 through transistor Q1 to pin 2 of connector DB-9 or pin 3 of connector DB-25.

Then, when +5 volts is present at serial port 1, the emitter-base of transistor Q2 is reverse biased, turning off transistor Q2 which turns off transistor Q1. As a result, the 9 volts at pin 7 of connector DB-9 or pin 4 of connector DB-25 is supplied through resistor 270 to pin 2 of connector DB-9 or pin 3 of connector DB-25.

The circuit portion 230B is shown in FIG. 22 and performs a receiving function for the control device 10. When pin 3 of connector DB-9 or pin 2 of connector DB-25 is at −9 volts, its normal resting state, then HTXD at serial port 3 is at 0 volts. When pin 3 of connector DB-9 or pin 2 of connector DB-25 goes to +9 volts, HTXD at serial port 3 goes to plus 5 volts. Pin of connector DB-9 or pin 7 of connector DB-25 is directly connected to serial port 2 and always stays at ground.

In transmitting data to the control device 10, the programming computer supplies +9 v or −9 v to pin 3 of connector DB-9 or pin 2 of connector DB-25. When +9 v is present on IBMTXD, 4.3 volts established by Zener diode 272 is passed through diode 274 to serial port 3.

When −9 v is present on IBMTXD, the Zener diode 272 to −0.6 volts resulting in conduction through transistor Q3 pulling serial port 3 to 0 volts.

The diode 274, the transistor Q3 and a resistor 276 connected as shown are provided to allow pressing a key 25 on keyboard 26 to "wake up" CPU 56 (actuate the wake up circuit 70) even though circuit portion 230B is connected to the control device 10.

An important feature of the universal remote control system of the present invention is the inclusion therein of a data transmission system which enables all types of data and particularly code data relating to codes for generating infrared signals for operating various control devices to be input into the memory, such as the RAM, of the universal remote control. With this capability, the user of the universal remote control can quickly and simply input data into the universal remote control, whether it had code operating data therein or not, to control a variety of controllable devices.

It is even possible that data can be input into the universal remote control which will enable the remote control to become a video game or perform any number of functions in addition to controlling controllable devices such a VCR or television set.

The data transmission systems are illustrated in FIGS. 23-26 and will now be described below with reference to those figures.

Figure 23:
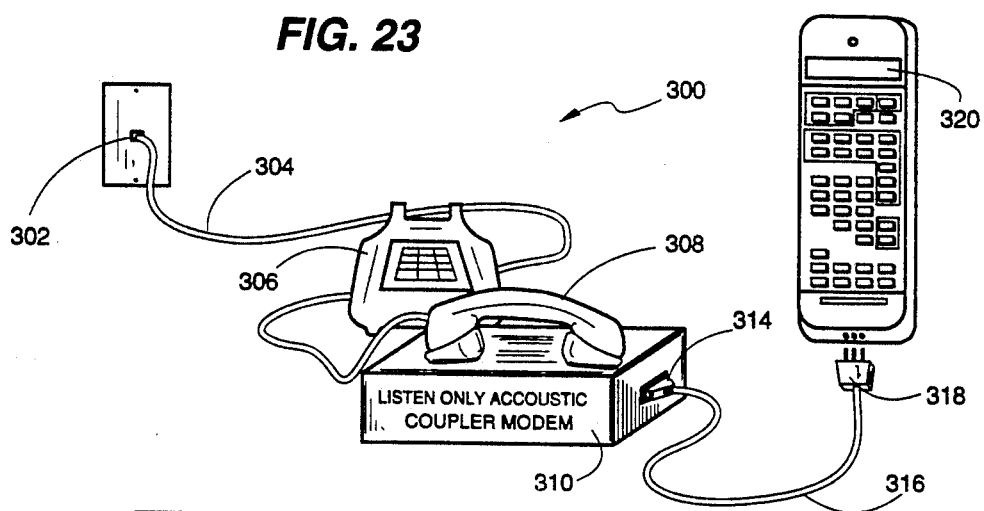
FIG. 23 is a schematic block diagram of the data transmission system of the universal remote control system of the present invention and shows the manner in which data is input via a telephone line to the remote control.

Referring now to FIG. 23 in greater detail, there is shown a data transmission system 300 which includes a conventional telephone jack 302, such as an RJII jack, which is connected to a telephone line and which has a cable 304 extending therefrom to a telephone 306. A handset 308 of the telephone is then adapted to be attached to a listen-only acoustic coupler modem 310 which will pick up and convert acoustic telephone signals to digital signals for transmission to a universal remote control 312. In other words, once the user has accessed a code number such as a 900 number, has pressed a sequence of keys on the telephone and receives a signal over the telephone 306 that the telephone 306 is ready to communicate code data to him, he then places the handset 308 on the modem 310.

Then an RS232 connector 314 is connected to the modem 310 and a cable 316 extends therefrom to a three-prong jack 318 which is adapted to mate with and connect to three serial ports, which, in the universal remote 312, are located on the bottom edge of the remote control 312. It will also be noted that the remote control 312 has a visual display 320 which can be a liquid crystal display or other type of visual display whereby information regarding the data being input can be communicated to the user.

Figure 24:
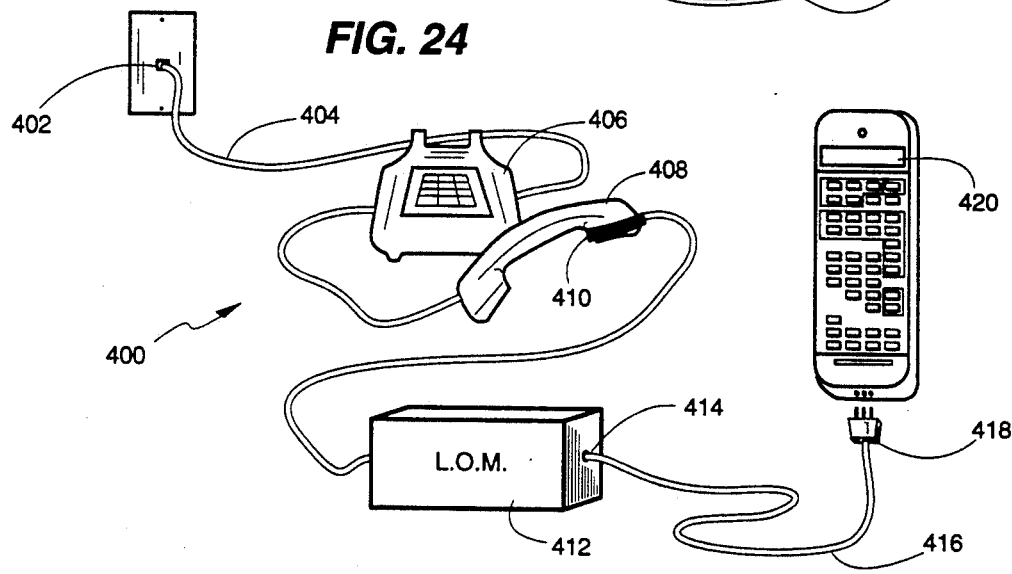
FIG. 24 is a block schematic diagram of a modified data transmission system similar to the data transmission system shown in FIG. 23 for inputting data via a telephone line to the remote control using a pickup coil.

FIG. 24 illustrates a modified data transmission system 400 which includes a telephone jack 402 which is typically an RJ11 jack that connects to a telephone line and which has a cable 404 leading to a telephone 406. A handset 408 of the telephone 406 has a pick-up coil 410 connected thereto. The pick-up coil 410 then extends to a listen-only modem 412 which is connected by an RS232 serial port 414 to a cable 416 leading to a three-prong jack 418 that is connected to the bottom of a universal remote control 420 in the same manner as in FIG. 23.

Figure 25:
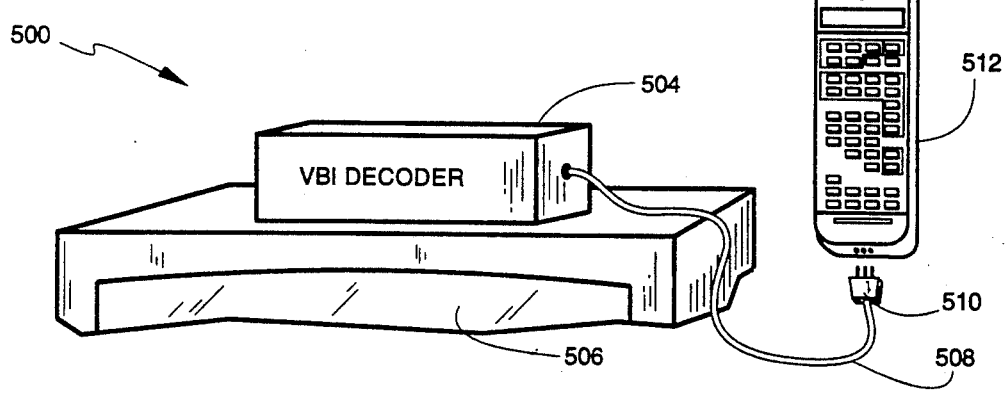
FIG. 25 is a block schematic diagram of another embodiment of a data transmission system which utilizes the vertical blanking interval on a raster across a television screen for transmitting data to the remote control and shows a vertical blanking interval decoder and a cable with a three-pin jack pluggable into the remote control for transmitting data to the remote control.

In FIG. 25 there is illustrated still another data transmission system 500. In this system, a television 502 has a vertical blanking interval decoder 504 connected thereto whereby data that is stored on the vertical blanking interval as a raster scan is made across the television screen 506 of the television 502 is picked up by the decoder 507 and decoded. Then, this data is supplied via a cable 508 and a three-prong jack 510 and the serial ports in a universal remote control 512 to the memory of the remote control 512. With this data transmission system 500, data is obtained directly from the television set for inputting data into the memory of the universal remote control 512.

Figure 26:
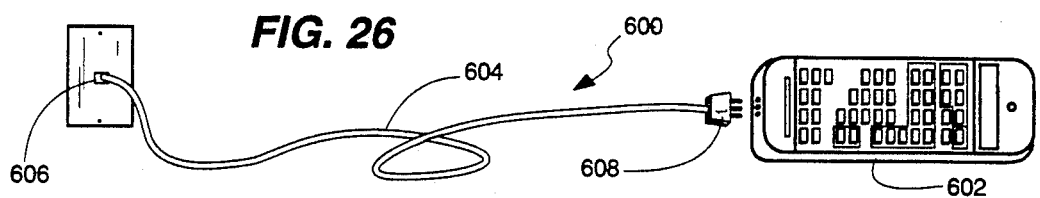
FIG. 26 is a block schematic diagram of a direct connection from a digital telephone line to the remote control having a direct access arrangement therein for inputting data to the remote control.

In FIG. 26 is illustrated a simplified data transmission system 600 which is based upon the use of a digital data, telephone line or integrated services digital network (ISDN) (not shown) whereby data can be input directly over the telephone line to the universal remote control 602.

In the data transmission system 600, the universal remote control 602 has a modem (not shown) therein which includes a direct access arrangement to enable communication via a cable 604 connected to a telephone jack 606 and to a three-prong jack 608 directly with a source of data that can be a large mainframe computer that is connected to the ISDN for transmitting data to the universal remote control 602.

From the foregoing description, it will be apparent that the universal remote control 10, the signal coupling and converting assembly 206, and the data transmission system 300, 400, 500 or 600 of the present invention have a number of advantages, some of which have been described above and others of which are inherent in the invention disclosed herein. For example:

1) With no ROM in the circuitry 42, the instruction codes and code data in the RAM 54 can be upgraded at any time via the serial ports 1, 2 and 3.

2) By loading the instruction codes and initial code directly into the RAM 54 by tri-stating the CPU 56, the circuitry 42 is enabled to function without a ROM.

3) The serial ports 1, 2 and 3 together with the signal coupling and converting assembly 206 and the data transmitting system 300, 400, 500 or 600 enable data to be input into the circuitry 42 from a telephone line or a television set, an RS-232 interface device and a three pin jack to the serial ports 1, 2 and 3.

4) The visible LED 4 providing red/green/yellow/off blink code provides a means for communicating to the user where the device 10 has "landed" after searching for codes to control a specific apparatus. The user can then look up in the instruction booklet what extended functions are available via the letter keys A-H or number keys, plus the DO key for that particular apparatus or equipment.

5) The write-protect circuit 78 prevents corruption of the operating program or data in the RAM 54 during transient states when the microprocessor is being turned on or turned off.

6) The multiplexing of the address and data lines between the RAM 54 and the CPU 56 enables scrambling of the instruction codes and the code data so that the memory image in the RAM 54 is encrypted.

7) The construction of the keyboard 61 enables one to have 56 keys which can be decoded using only 8 bidirectional input (and output) ports 63.

8) The keyboard 61 including the keyboard circuitry 62 plus the wakeup circuit 70 provides a system whereby pressing any key turns on power to the CPU 56.

9) The provision of three infrared LEDs 1, 2 and 3 with no current-limiting resistors enables the device 10 to use maximum energy to create the infrared control pulses with a minimum amount of energy wasted.

10) The DO keys together with the numeral and letter keys allow a number of DO functions to be performed with the device 10 by a user.

11) Any combination of products can be controlled with the universal remote control device 10.

12) The step-and-set method for locating the code data for generating the infrared code necessary to operate the user's equipment or for the user to learn that such code data is not present in the library in the RAM 54.

I claim:

1. A universal remote control system including a computer having a memory, code data for creating appropriate infrared (IR) lamp driver instructions for causing an infrared signal generator to emit infrared signals which will cause specific functions to occur in a specific controlled device, for operating a variety of devices to be controlled, stored in said memory of said computer, a universal remote control comprising input means including a set of keys or pushbuttons for inputting commands into the remote control, infrared signal output means including IR lamp driver circuitry for supplying an infrared signal to a controlled device, a central processing unit (CPU) coupled to said input means and to said signal output means, memory means coupled to said CPU, and data coupling means for periodically coupling said computer to said remote control for receiving from said computer memory said code data for creating appropriate IR lamp driver instructions for causing said infrared signals which will cause specific functions to occur in a specific controlled device, for operating a variety of devices to be controlled into said memory means of said remote control to enable said remote control to control various devices to be controlled upon the inputting of commands to the keys of the input means and a data transmission system including said data coupling means for coupling said remote control to said computer, directly, through a telephone line, through a modem and a telephone line, or through decoding means and a television set to receive a television signal picked up by the television set.

2. A universal remote control system including a universal remote control comprising input means including a set of keys or pushbuttons for inputting commands into the remote control, infrared signal output means including infrared (IR) lamp driver circuitry for supplying an infrared signal to a controlled device, a central processing unit (CPU) coupled to said input means and to said signal output means, memory means coupled to said CPU and data coupling means including terminal means comprising a receiving port coupled to said CPU for enabling code data for creating appropriate IR lamp driver instructions for causing said infrared signal output means to emit infrared signals which will cause specific functions to occur in a specific controlled device, for operating a variety of devices to be controlled, to be supplied from outside said remote control through said receiving port of said terminal means directly to said CPU for direct entry to said memory means to enable said remote control to control various devices to be controlled upon the inputting of commands to the keys of the input means and a data transmission system including coupling means for coupling said terminal means to a computer, directly, through a telephone line, through a modem and a telephone line, or through decoding means and a television set to receive a television signal picked up by the television set.

3. The universal remote control system of claim 2 wherein said data-transmission system includes a serial port connector for connecting to said remote control, a cable connected to said serial port connector and means for coupling said connector to the telephone line or to the television set.

4. The universal remote control system of claim 3 wherein said coupling means include a vertical blanking interval decoder, defining a decoding means, connected to the television set.

5. The universal remote control system of claim 3 wherein said remote control includes a direct access arrangement and said coupling means includes a telephone jack connected to the other end of said cable for ISDN data line transmission.

6. The universal remote control system of claim 3 wherein said data transmission system includes an RS232 serial port connector, a modem to which the RS232 serial port connector is connected to, and telephone line coupling means for coupling said modem to the telephone line.

7. The universal remote control system of claim 6 wherein said telephone line coupling means includes pick-up coil that couples to a handset of a telephone and is coupled by the telephone line to said modem.

8. The universal remote control system of claim 5 wherein said modem is an acoustic coupler modem which is adapted to receive therein a handset of a telephone and acoustically pick up the sound transmission from the handset.

9. The universal remote control system of claim 6 wherein said modem is a listen only modem.

10. The universal remote control system of claim 9 wherein said memory means include a non-volatile, read-write memory.

11. The universal remote control system of claim 9 wherein said universal remote control further includes a visual display coupled to the CPU whereby various data including information about the data being input into said memory means can be displayed on said visual display to a user.

12. The universal remote control system of claim 9 wherein said terminal means comprise three serial ports coupled to said CPU, one port being coupled to the ground for the CPU, one port, forming said receiving port, being coupled to an input of said CPU and one port, forming a sending port, being coupled to an output of said CPU.

13. The universal remote control system of claim 9 wherein said coupling means includes a cable, first connector means at one end of said cable for connection to said terminal means, and interface connector means at the other end of said cable for connecting to a computer, directly, through a telephone line, through a modem and a telephone line, or through decoding means and the television set to receive the television signal which has data from the computer.

14. The universal remote control system of claim 13 wherein said interface connector means includes a sending circuit comprising an input terminal connected to said sending port of said terminal means and three output ports including a first, minus voltage, output port, a second, plus or minus, voltage output port, and a third, plus voltage, output port, a ground terminal, a first transistor having a first emitter, a first collector and a first base, said first output port being coupled through a resistor to said second output port, said first collector being connected to said second output port, said emitter being connected to said first output port, a second transistor having a second emitter, a second collector and a second base, said second emitter being connected to said first input terminal connected to said cable, said ground terminal being coupled through a Zener diode to said second base, a resistor coupled between said second base and a junction between said first collector and said first output port, and said first base being coupled through a resistor to said second collector.

15. The universal remote control system of claim 13 wherein said interface connector means includes a receiving circuit connected, on one side, to a ground input terminal and a signal input terminal, and, on the other side, to an output terminal connected by said cable to said receiving port and to a ground output terminal which is connected to the ground input terminal and through said cable to said CPU ground, said input terminal being connected through a resistor to a first junction, a Zener diode connected between said ground terminals and said first junction, a diode coupled between said first junction and said signal output terminal, a transistor having a collector base and an emitter, said emitter being connected to said first junction, said collector being connected to said signal output terminal, and said base being coupled through a resistor to a junction between said diode and said output terminal.

16. The universal remote control system of claim 15 wherein said interface connector means includes a sending circuit comprising an input terminal connected to said sending port of said terminal means and three output ports including a first, minus voltage, output port, a second, plus or minus, voltage output port, and a third, plus voltage, output port, a ground terminal, a first transistor having a first emitter, a first collector and a first base, said first output port being coupled through a resistor to said second output port, said first collector being connected to said second output port, said emitter being connected to said first output port, a second transistor having a second emitter, a second collector and a second base, said second emitter being connected to said first input terminal connected to said cable, said ground terminal being coupled through a Zener diode to said second base, a resistor coupled between said second base and a junction between said first collector and said first output port, and said first base being coupled through a resistor to said second collector.

17. The universal remote control system of claim 16 wherein said cable is a three wire cable including a wire for connecting said input terminal of said sending circuit to said sending port of said terminal means, a wire for connecting said ground terminal of said receiving circuitry to said port of said terminal means coupled to ground for the CPU, and wire for connecting said input terminal of said receiving circuit to said receiving port of said terminal means.

18. The universal remote control system of claim 17 wherein a DB-9 connector is connected to the terminals and ports of aid receiving and sending circuits of said interface connector means 19. The universal remote control system of claim 17 wherein a DB-25 connector is connected to said terminals and port of said sending circuit and said receiving circuit of said interface connector means.

20. A universal remote control system including a computer having a memory, code data for creating appropriate infrared (IR) lamp driver instructions for causing an infrared signal generator to emit infrared signals which will cause specific functions to occur in a specific controlled device, for operating a variety of devices to be controlled, stored in said memory of said computer, a universal remote control comprising input means including a set of keys or pushbuttons for inputting commands into the remote control, infrared signal output means including IR lamp driver circuitry for supplying an infrared signal to a controlled device, a central processing unit (CPU) coupled to said input means and to said signal output means, memory means coupled to said CPU, and data coupling means for periodically coupling said computer to said remote control for receiving from said computer memory and inputting into said memory means of said remote control said code data for creating IR lamp driver instructions, said code data causing said infrared signal output means to emit infrared signals which will cause specific functions to occur in a specific controlled device when said input means are operated, and said code data operating a variety of devices to be controlled and enabling said remote control to control various devices to be controlled upon the inputting of commands to said keys of said input means.

* * * * *

UNITED STATES PATENT AND TRADEMARK OFFICE
CERTIFICATE OF CORRECTION

PATENT NO. : 5,255,313
DATED : October 19, 1993
INVENTOR(S) : Paul V. Darbee

It is certified that error appears in the above-indentified patent and that said Letters Patent is hereby corrected as shown below:

On the title page, item [54] and in column 1, line 2, in the Title before "Universal" insert --Infrared--.

Column 3, line 26 "lien" should be --line--.

Column 3, line 45&46 " assembly 15" should be -- assembly --.

Column 7, line 30 "3." should be --3--.

Column 10, line 9 "infrared carrier" should be --infrared codes. FIGS. 11a-11g illustrate different types of gated carrier--.

Column 10, line 50 "function 7 key" should be --function key--.

Column 12, line 18 "Enter." should be -- Enter, --.

Column 15, line 8 "D02" should be --DO2--.

Column 15, line 20 "D02" should be --DO2--.

Column 15, line 31 "The Keyboard 61" should be a subtitle on the next line.

Column 17, line 25 "3.0" should be --30--.

Column 17, line 67 "VCR." should be --VCR--.

Column 18, line 1 "Cable." should be --Cable,--.

Column 18, line 5 "DO." should be --DO,--.

UNITED STATES PATENT AND TRADEMARK OFFICE
CERTIFICATE OF CORRECTION

PATENT NO. : 5,255,313
DATED : October 19, 1993
INVENTOR(S) : Paul V. Darbee

It is certified that error appears in the above-indentified patent and that said Letters Patent is hereby corrected as shown below:

Column 18, line 46 "Do" should be —DO;—.

Column 18, line 57 "DO." should be —DO;—.

Column 18, line 58 "Cable." should be —Cable).—.

Column 19, line 26 "D0." should be —DO,—.

Column 22, line 61 after "infrared" insert —signal output means to emit infrared—.

Column 26, line 17 after "creating" insert —appropriate—.

Signed and Sealed this

First Day of November, 1994

Attest:

BRUCE LEHMAN

Attesting Officer

Commissioner of Patents and Trademarks